United States Patent
Fay et al.

(10) Patent No.: US 7,872,332 B2
(45) Date of Patent: Jan. 18, 2011

(54) INTERCONNECT STRUCTURES FOR STACKED DIES, INCLUDING PENETRATING STRUCTURES FOR THROUGH-SILICON VIAS, AND ASSOCIATED SYSTEMS AND METHODS

(75) Inventors: Owen R. Fay, Meridian, ID (US); Warren M. Farnworth, Nampa, ID (US); David R. Hembree, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 128 days.

(21) Appl. No.: 12/209,029

(22) Filed: Sep. 11, 2008

(65) Prior Publication Data
US 2010/0059897 A1 Mar. 11, 2010

(51) Int. Cl.
- H01L 29/40 (2006.01)
- H01L 23/52 (2006.01)
- H01L 23/48 (2006.01)
- H01L 21/768 (2006.01)

(52) U.S. Cl. .............. 257/621; 257/774; 257/773; 257/686; 257/E21.597

(58) Field of Classification Search .............. 257/621, 257/773, 774, 686, E21.597
See application file for complete search history.

(56) References Cited

U.S. PATENT DOCUMENTS

| | | |
|---|---|---|
| 5,128,831 A | 7/1992 | Fox, III et al. |
| 5,252,857 A | 10/1993 | Kane et al. |
| 5,380,681 A | 1/1995 | Hsu et al. |
| 5,682,062 A | 10/1997 | Gaul |
| 5,883,426 A | 3/1999 | Tokuno et al. |
| 5,946,553 A | 8/1999 | Wood et al. |
| 5,986,209 A | 11/1999 | Tandy |
| 6,020,624 A | 2/2000 | Wood et al. |
| 6,028,365 A | 2/2000 | Akram et al. |
| 6,051,878 A | 4/2000 | Akram et al. |
| 6,072,233 A | 6/2000 | Corisis et al. |
| 6,097,087 A | 8/2000 | Farnworth et al. |
| 6,175,149 B1 | 1/2001 | Akram |
| 6,225,689 B1 | 5/2001 | Moden et al. |

(Continued)

FOREIGN PATENT DOCUMENTS

EP 1415950 A2 5/2004

(Continued)

OTHER PUBLICATIONS

Search Report and Written Opinion issued Feb. 24, 2010 for International Application No. PCT/US2009/054313.

(Continued)

*Primary Examiner*—Luan C Thai
(74) *Attorney, Agent, or Firm*—Perkins Coie LLP

(57) ABSTRACT

Interconnect structures for stacked dies, including penetrating structures for through-silicon vias, and associated systems and methods are disclosed. A system in accordance with a particular embodiment includes a first semiconductor substrate having a first substrate material, and a penetrating structure carried by the first semiconductor substrate. The system further includes a second semiconductor substrate having a second substrate material with a preformed recess. The penetrating structure of the first semiconductor substrate is received in the recess of the second semiconductor substrate and is mechanically engaged with the recess and secured to the second semiconductor substrate.

21 Claims, 18 Drawing Sheets

U.S. PATENT DOCUMENTS

| | | |
|---|---|---|
| 6,235,554 B1 | 5/2001 | Akram et al. |
| 6,400,008 B1 | 6/2002 | Farnworth |
| 6,437,441 B1 | 8/2002 | Yamamoto et al. |
| 6,459,150 B1 | 10/2002 | Wu et al. |
| 6,580,174 B2 | 6/2003 | McCormick et al. |
| 6,620,731 B1 | 9/2003 | Farnworth et al. |
| 6,667,551 B2 | 12/2003 | Hanaoka et al. |
| 6,703,310 B2 | 3/2004 | Mashino et al. |
| 6,809,421 B1 | 10/2004 | Hayasaka et al. |
| 6,873,054 B2 | 3/2005 | Miyazawa et al. |
| 6,936,913 B2 * | 8/2005 | Akerling et al. .............. 257/686 |
| 6,982,487 B2 | 1/2006 | Kim et al. |
| 7,091,124 B2 | 8/2006 | Rigg et al. |
| 7,262,495 B2 | 8/2007 | Chen et al. |
| 7,271,482 B2 | 9/2007 | Kirby |
| 7,300,857 B2 | 11/2007 | Akram et al. |
| 7,592,700 B2 * | 9/2009 | Sunohara et al. ............. 257/737 |
| 2002/0017710 A1 * | 2/2002 | Kurashima et al. .......... 257/686 |
| 2002/0100988 A1 | 8/2002 | Shimada et al. |
| 2003/0045085 A1 | 3/2003 | Taniguchi et al. |
| 2003/0119308 A1 | 6/2003 | Geefay et al. |
| 2004/0016942 A1 | 1/2004 | Miyazawa et al. |
| 2006/0003566 A1 | 1/2006 | Emesh |
| 2006/0223301 A1 | 10/2006 | Vanhaelemeersch et al. |
| 2006/0278979 A1 | 12/2006 | Rangel |
| 2006/0292877 A1 | 12/2006 | Lake |
| 2007/0020805 A1 | 1/2007 | Kim et al. |
| 2007/0111386 A1 | 5/2007 | Kim et al. |
| 2007/0222050 A1 | 9/2007 | Lee et al. |
| 2007/0267138 A1 | 11/2007 | White et al. |
| 2007/0293040 A1 | 12/2007 | Emesh et al. |
| 2008/0169563 A1 | 7/2008 | Awano et al. |
| 2008/0237881 A1 | 10/2008 | Dambrauskas et al. |
| 2009/0014843 A1 * | 1/2009 | Kawashita et al. .......... 257/621 |

FOREIGN PATENT DOCUMENTS

| | | |
|---|---|---|
| JP | 08307043 A | 11/1996 |
| JP | 10163267 A | 6/1998 |
| JP | 2002373910 A | 12/2002 |
| WO | 03065450 A2 | 8/2003 |
| WO | WO-2006098026 A1 | 9/2006 |

OTHER PUBLICATIONS

De Boer, M.J. et al., "Micromachining of Buried Micro Channels in Silicon," Journal of Microelectromechanical Systems, vol. 9, No. 1, Mar. 2000, IEEE, ISSN: 1057-7157.

Keigler, A. et al., "Enabling 3-D Design," Semiconductor International, Aug. 1, 2007, <URL: http://www. semiconductor.net/article/CA6462379.html>.

µPILR™ DRAM Stacking, Tessera, Inc., [retrieved on May 16, 2008], <URL: http://www.tessera.com/technologies/products/micro_contact/dramstack/htm>.

µPILR™ Package Stacking Technology Applications, Tessera, Inc., [retrieved on May 5, 2008], <URL: http://www.tessera.com/technologies/products/micro_contact/flashstack.htm>.

µPILR™ Mobile Memory & Logic + Memory Stacking, Tessera, Inc., [retrieved on May 16, 2008], <URL: http://www.tessera.com/technologies/products/micro_contact/mobilemem.htm>.

µPILR™ Interconnect Platform, µPILR™ Product Overview, Tessera, Inc., [retrieved on May 16, 2008], <URL: http://www.tessera.com/technologies/products/micro_contact>.

µPILR™ Package Stacking Technology, µPILR™ Data Sheet, Tessera, Inc., [retrieved on May 16, 2008], <URL: http://www.tessera.com/technologies/products/micro_contact>.

µPILR™ Interconnect Platform, Tessera, Inc., [retrieved on May 16, 2008], <URL: http://www.tessera.com/technologies/products/micro_contact/index.htm>.

"Tessera Introduces Next-Generation Interconnect Platform", Press Release, Tessera, Inc., Apr. 16, 2007, <URL: http://www.tessera.com/technologies/products/micro_contact>.

* cited by examiner

INTERCONNECT STRUCTURES FOR STACKED DIES, INCLUDING PENETRATING STRUCTURES FOR THROUGH-SILICON VIAS, AND ASSOCIATED SYSTEMS AND METHODS

TECHNICAL FIELD

The present disclosure is directed generally to interconnect structures for stacked dies including penetrating structures for through-silicon vias, and associated systems and methods.

BACKGROUND

Packaged semiconductor dies, including memory chips, microprocessor chips, and imager chips, typically include a semiconductor die mounted to a substrate and encased in a plastic protective covering. The die includes functional features, such as memory cells, processor circuits, imager devices, and interconnecting circuitry. The die also typically includes bond pads electrically coupled to the functional features. The bond pads are electrically connected to pins or other types of terminals that extend outside the protective covering for connecting the die to busses, circuits, and/or other microelectronic assemblies.

Market pressures continually drive manufacturers to reduce the size of semiconductor die packages and to increase the functional capacity of such packages. One approach for achieving these results is to stack multiple semiconductor dies in a single package. The dies in such a package are typically interconnected by electrically coupling the bond pads of one die in the package with bond pads of other die(s) in the package.

A variety of approaches have been used to electrically interconnect the dies within a multi-die package. One existing approach is to use solder balls connected directly between the bond pads of neighboring dies. Another approach is to fuse "bumps" on the bond pads of neighboring dies. However, the foregoing processes can suffer from several drawbacks. For example, in some cases, the connections between bond pads of neighboring dies may be incomplete and/or may fail under certain conditions. In addition, the temperature typically required to form the bonds between neighboring dies may consume a significant portion of the total thermal budget allotted to the package for processing. Accordingly, the bonding process can limit the life of the package and/or the thermal budget available for other processing steps required to form the package. As a result, there remains a need for improved techniques for interconnecting dies within a semiconductor package.

DETAILED DESCRIPTION

Several embodiments of the present disclosure are described below with reference to packaged semiconductor devices and assemblies, and methods for forming packaged semiconductor devices and assemblies. Many details of certain embodiments are described below with reference to semiconductor dies. The term "semiconductor die" is used throughout to include a variety of articles of manufacture, including, for example, individual integrated circuit dies, imager dies, sensor dies, and/or dies having other semiconductor features. Many specific details of certain embodiments are set forth in FIGS. 1-12 and the following text to provide a thorough understanding of these embodiments. Several other embodiments can have configurations, components, and/or processes different than those described in this disclosure. A person skilled in the relevant art, therefore, will appreciate that additional embodiments may be practiced without several of the details and/or features of the embodiments shown in FIGS. 1-12, and/or with additional details and/or features.

Figure 1:
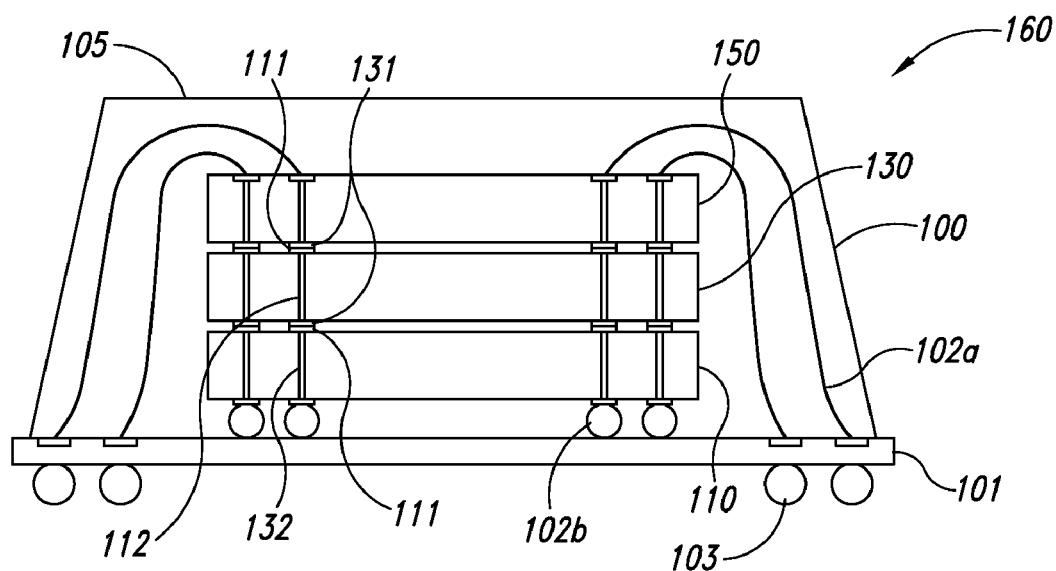
FIG. 1 is a partially schematic, side cross-sectional view of a package configured in accordance with an embodiment of the disclosure.

FIG. 1 is a partially schematic, side cross-sectional view of a semiconductor system 160 that includes a semiconductor package 100 configured in accordance with an embodiment of the disclosure. The package 100 can include a support member 101 that carries multiple semiconductor substrates (e.g., semiconductor dies) that are interconnected electrically and mechanically with each other. For example, the support member 101 can carry a first semiconductor substrate 110, a second semiconductor substrate 130 stacked on the first semiconductor substrate 110, and a third semiconductor substrate 150 stacked on the second semiconductor substrate 130. Each of the semiconductor substrates can include one or more connectors for connecting the substrate to a neighboring substrate. For example, the first substrate 110 can include first connectors 111 that face toward the second substrate 130. The second substrate 130 can include second connectors 131 that face toward the first substrate 110 and connect with the corresponding first connectors 111. The second substrate 130 can also include its own first connectors 111 that connect with corresponding second connectors 131 of the third substrate 150.

Each of the semiconductor substrates can include features that facilitate electrical signal communication within the substrate. For example, the connectors 111, 131 can communicate with other features in the semiconductor substrates through one or more vias. The first semiconductor substrate 110 can accordingly include a first via 112, and the second semiconductor substrate 130 can include a second via 132. The vias 112, 132 in particular embodiments can include through-silicon vias (TSVs) or other vias that extend entirely through the corresponding substrate material to facilitate interconnections with stacked dies.

The package 100 can include additional features for providing communication with elements outside the package, and for providing communication between or among the substrates within the package. For example, the support member 101 can include package connectors 103 (e.g., solder balls) that facilitate connecting the package 100 to circuit boards or other external devices. The support member 101 can also include support member connectors that connect the support member 101 with the semiconductor substrates 110, 130 and 150. For example, these connections can be provided by first support member connectors 102*a* (e.g., wire bonds) and/or second support member connectors 102*b* (e.g., solder balls). The entire package 100 can be surrounded by an encapsulant 105 that protects the inner features of the package 100, including the interconnections between neighboring semiconductor substrates. The following discussion describes additional features of these interconnections.

Figure 2:
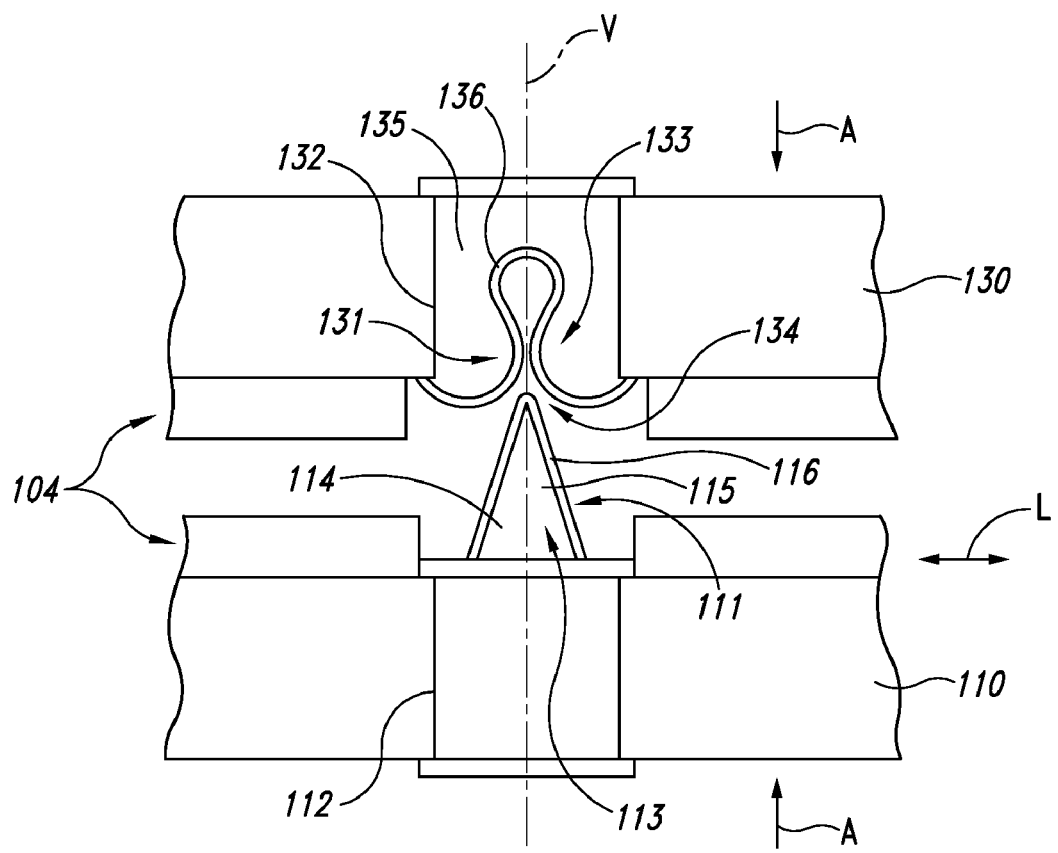
FIG. 2 is a partially schematic, side cross-sectional view of an interconnection arrangement between two dies in accordance with an embodiment of the disclosure.

FIG. 2 is an enlarged, partially schematic illustration of an interface region between the first substrate 110 and the second substrate 130, configured in accordance with a representative embodiment of the disclosure. The first substrate 110 is positioned proximate to the second substrate 130 such that the first via 112 and the second via 132 are aligned along a common via axis V. The first substrate 110 includes a first connector 111 and the second substrate 130 includes a second connector 131, both of which are also aligned along the via axis V. The first connector 111 includes a penetrating structure 114, and the second connector 131 includes a recess 134 configured to receive the penetrating structure 114. The recess 134 can be pre-formed; e.g., it can be formed in whole or in part before the penetrating structure 114 is received in it. Both the first connector 111 and the second connector 131 include conductive materials which may in turn include one or more conductive constituents. For example, the first connector 111 can include a first conductive material 113 that in turn includes a base material 115 and a conductive layer 116, e.g., a coating or cladding. The second connector 131 can include a second conductive material 133 that in turn includes a base material 135 and a conductive layer or coating 136. As will be discussed in further detail later, the base materials 115, 135 for each of the corresponding connectors 111, 131 can be selected for structural and electrical properties, and the coatings 116, 136 for each of the corresponding connectors 111, 131 can be selected to facilitate, enhance, and/or protect the connection between the two connectors.

In operation, the first and second semiconductor substrates 110, 130 can be connected by moving one both of the substrates toward the other along the via axis V, as indicated by arrows A, thus pressing the penetrating structure 114 into the recess 134. The penetrating structure 114 can cut into and/or deform the second conductive material 133 during this process, to provide an enhanced mechanical and electrical engagement between the two connectors. In addition, the penetrating structure 114 can include surfaces that have a component (and in many cases, a significant component) projected into a plane parallel to the via axis V. Accordingly, when it is engaged with the recess 134, the penetrating structure 114 can resist relative lateral movement between the first substrate 110 and the second substrate 130 (indicated by arrow L). This in turn can result in an interconnection structure that is mechanically and electrically more robust than existing interconnection structures. Additional support and protection for the interconnection structures can be provided by an adhesive 104 (e.g., a thin bond line adhesive) disposed on the first substrate 110 and/or the second substrate 130. As the first and second substrates 110, 130 are brought into contact with each other, the adhesive 104 can provide an additional mechanical connection between the substrates, and can protect the interconnection from exposure to oxidants and/or other undesirable elements. The adhesive 104 can include any of a variety of suitable materials known to those of ordinary skill in the relevant art. For example, the adhesive 104 can include a pre-applied BCB or SU-8 adhesive, a liquid crystal polymer, or a polymer-based Intervia™ adhesive, available from Rohm and Haas of Philadelphia, Pa. In other embodiments, the adhesive 104 can be an underfill material, applied after the first and second substrates 110, 130 are joined.

In a particular embodiment, the coatings 116, 136 include tin. Prior to engaging the first and second substrates 110, 130 with each other, the coatings 116, 136 can be fluorinated, e.g., by exposure to a sulfur hexafluoride plasma. The resulting fluorinate tin oxide forms a dry flux which has favorable reflow characteristics, e.g., short reflow time and/or low reflow temperatures.

In an embodiment shown in FIG. 2, the first substrate 110 includes only first connectors 111, and the second substrate 130 includes only second connectors 131. Accordingly, the first substrate 110 can be deliberately manufactured (e.g., at the wafer level) using steps dedicated to forming the first connectors 111, and the second substrate 130 can be formed (e.g., at the wafer level) using steps dedicated to forming the second connectors 131. Each of the substrates 110, 130 can accordingly be processed with as few steps as are necessary to form the corresponding connectors 111, 131. In other embodiments, the substrate may include both first connectors 111 and second connectors 131. For example, when the second substrate 130 is positioned between the first substrate 110 and a third substrate 150 (as shown in FIG. 1), the second substrate 130 can include second connectors 131 to connect with the first substrate 110, and first connectors 111 to connect with the third substrate 150. Further details regarding the formation of both the first connectors 111 and the second connectors 131 are described below.

Figure 3A:
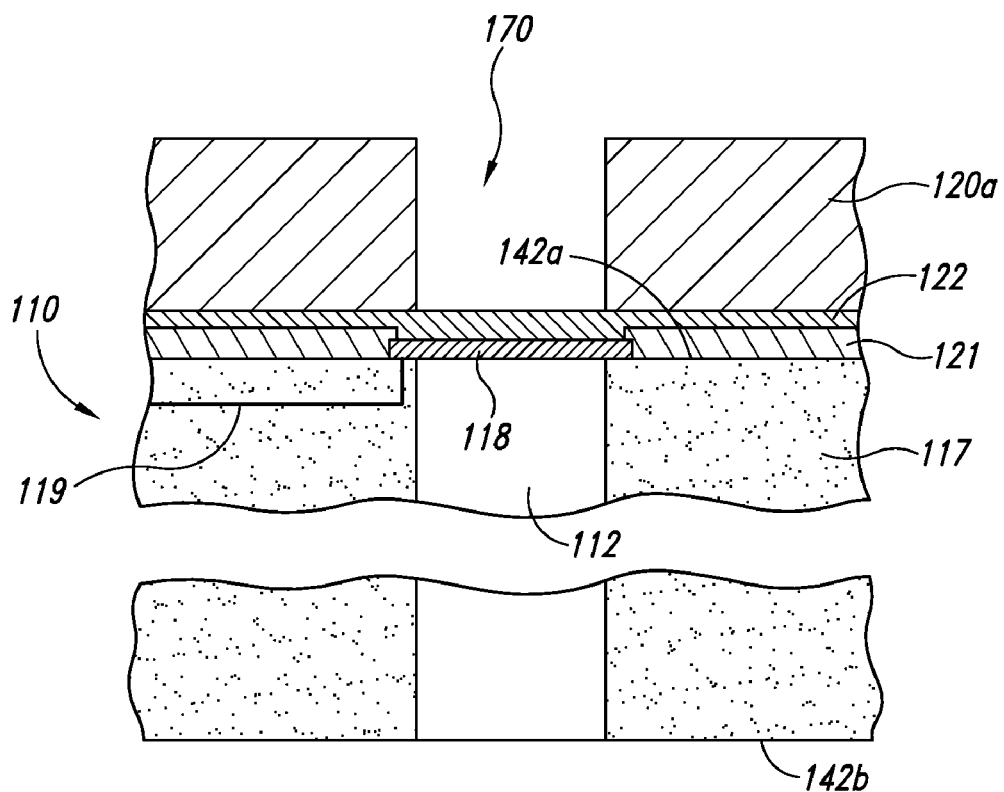
FIGS. 3A-3G schematically illustrate processes for forming projections in accordance with embodiments of the disclosure.

FIGS. 3A-3D illustrate a representative process for forming a first connector 111 in accordance with an embodiment of the disclosure. Beginning with FIG. 3A, the first substrate 110 can include a first substrate material 117 (e.g., silicon) having a first surface 142*a* and a second surface 142*b* facing away from the first surface 142*a*. The via 112 can extend entirely through the first substrate material 117 from the first surface 142*a* to the second surface 142*b*. The first substrate 110 can further include a bond pad 118 (e.g., a conductive pad for electrical and/or mechanical connections) at the first surface 142*a,* which is connected with other structures and devices of the first substrate 110 with one or more conductive lines 119. A dielectric material 121 is disposed at the first surface 142*a* to protect the first surface, and a plating buss 122 is disposed over the dielectric layer 121 to facilitate formation of additional conductive structures by electrolytic or other additive and/or subtractive processes. The plating buss 122 can include a titanium/tungsten alloy or other suitable conductive and/or adhesive material to provide for electrical communication and/or adhesion. As shown in FIG. 3A, a first mask 120*a* is positioned over the plating buss 122, and has an aperture 170 aligned with the via 112. In a representative embodiment, the first mask 120*a* includes a wet or dry thick film photoresist material, having a thickness of up to about 40 microns, and in a particular embodiment, approximately 15-20 microns. The aperture 170 can have a lateral dimension (e.g., a diameter) of about 10-20 microns, and can have a round, square or other suitable cross-sectional shape.

Figure 3B:
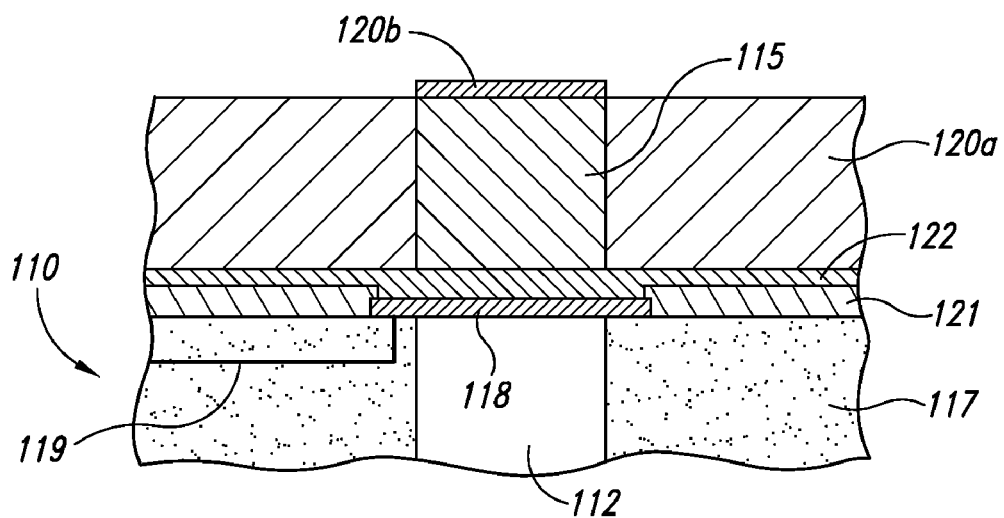

In FIG. 3B, the base material 115 is disposed in the aperture 170 of the first mask 120a, e.g., via an electrolytic process. The base material 115 can include nickel, copper, or an alloy of nickel or copper in particular embodiments. In other embodiments, the base material 115 can have other compositions, e.g., gold or a gold alloy. A second mask 120b is then positioned over the base material 115. The second mask 120b can include a sacrificial protective layer, formed using underbump metallurgy techniques. For example, the second mask 120b can include palladium or another sacrificial layer material applied in an electroless or other process.

Figure 3C:
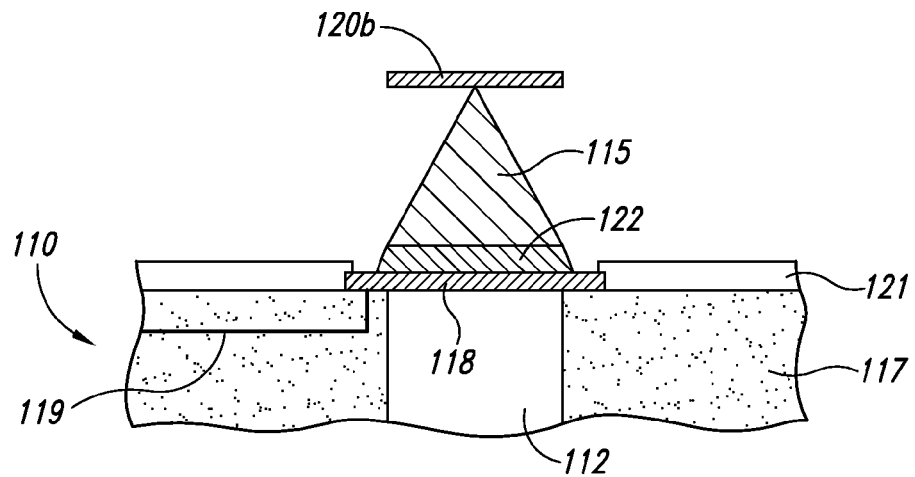

Referring next to FIG. 3C, the first mask 120a (FIG. 3B) is then removed, and the base material 115 is etched (e.g., using a wet etch process) or otherwise partially removed to form a structure having a generally triangular cross-sectional shape (e.g., a conical, pyramidal, or similar structure). For example, a sodium under-etch/over-etch process can be used to etch the base material 115. The presence of the second mask 120b protects the upper surface of the base material 115 so that the sides of the base material 115 are removed at a greater rate than the top of the base material 115. As the etching process proceeds, the second mask 120b eventually lifts off the base material 115 or otherwise dissipates. The portions of the plating buss 122 located away from the base material 115 are also removed, either via the same process as is used to remove the base material 115, or via a different, subsequent process.

Figure 3D:
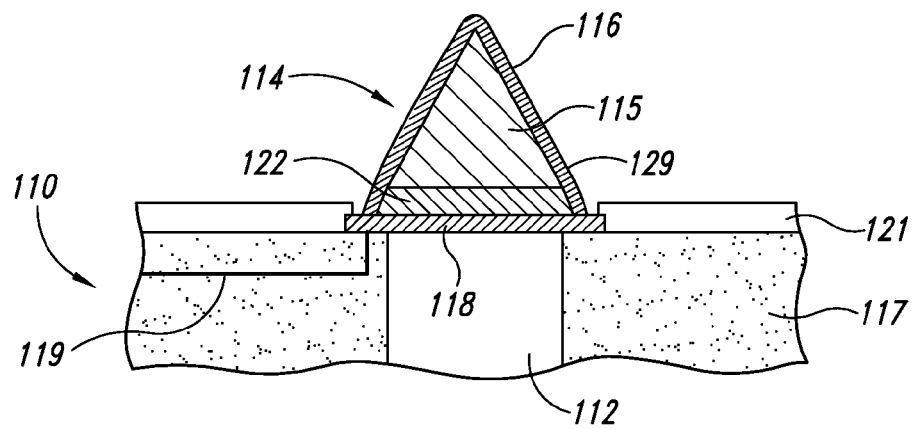

FIG. 3D illustrates the first substrate 110 after the etching process of the base material 115 has been completed, and a conductive coating 116 has been applied to the base material 115. In a particular embodiment, the conductive coating 116 can include tin or a tin alloy, and in other embodiments, the conductive coating 116 can have other compositions. Tin or a tin alloy can be particularly suitable in many instances because these materials reflow at relatively low temperatures, and can accordingly facilitate electrical and mechanical bonding without requiring a high temperature process. When the base material 115 includes copper or a copper alloy, the conductive coating 116 can be applied using an electroless immersion plating process or another process, e.g., sputtering or an electrolytic/masking process. For example, in other embodiments, a buss layer and patterned photoresist layer can be used to apply the conductive coating 116 via an electrolytic process. The conductive coating 116 can include materials other than tin or tin alloys, for example, gold. In still further embodiments, the conductive coating 116 can be eliminated. For example, when the base material 115 includes gold, it can be bonded directly to gold in a corresponding recess 134 (FIG. 2) of a second substrate 130 (FIG. 2), without the need for the conductive coating 116. Such a bonding process can be conducted at a temperature of up to 150° C. In particular embodiments, ultrasonic energy can be used to facilitate bonding, e.g., to reduce the mechanical force used to place and/or press the parts in contact with each other. In any of these embodiments, an external surface 129 of the resulting penetrating structure 114 can have a generally tapered shape that facilitates penetrating into the corresponding recess 134 of the second substrate 130. This shape, alone or in combination with the application of ultrasonic energy, can facilitate "scrubbing" the mating surfaces to remove contaminants and further facilitate the bond between the penetrating structure 114 and the recess 134.

Figure 3E:
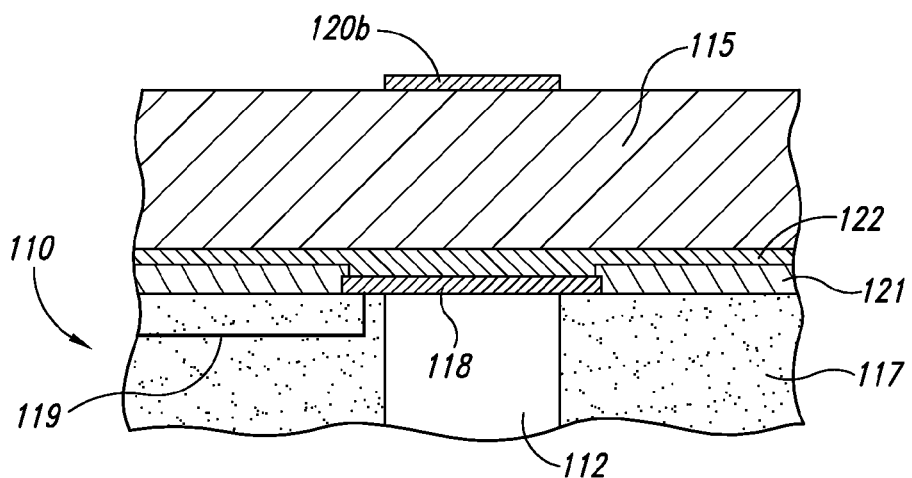
Figure 3F:
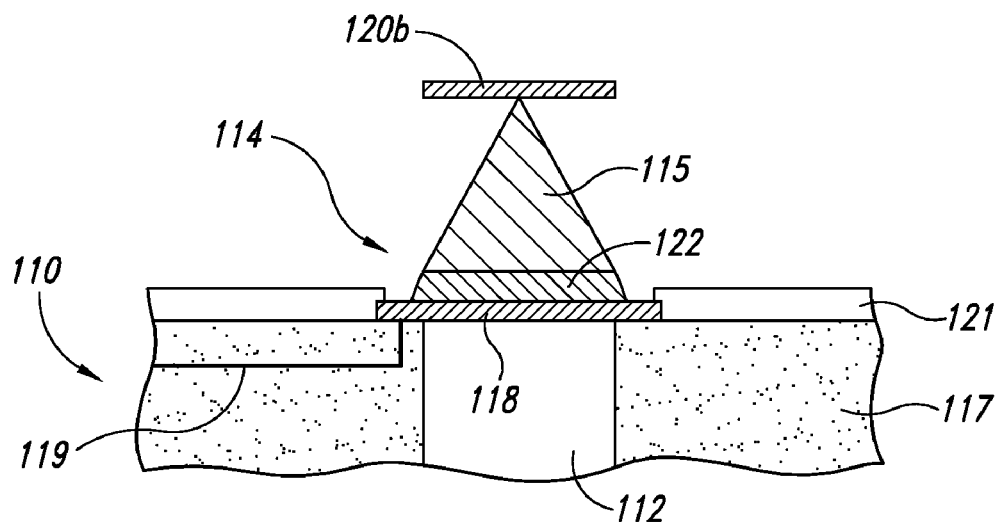

FIG. 3E is a schematic illustration of the first substrate 110 undergoing a process for forming a penetrating structure in accordance with another embodiment of the disclosure. In this embodiment, the conductive material 115 is applied uniformly (e.g., as a blanket layer), without the use of the first mask 120a described above with reference to FIG. 3A. The second mask 120b is applied to the base material 115 in alignment with the via 112. The base material 115 is then etched, with the second mask 120b providing protection of the base material 115 over the via 112, to produce the shape shown in FIG. 3F. The resulting penetrating structure 114 can then be coated with a conductive coating 116 in a manner generally similar to that described above with reference to FIG. 3D.

Figure 3G:
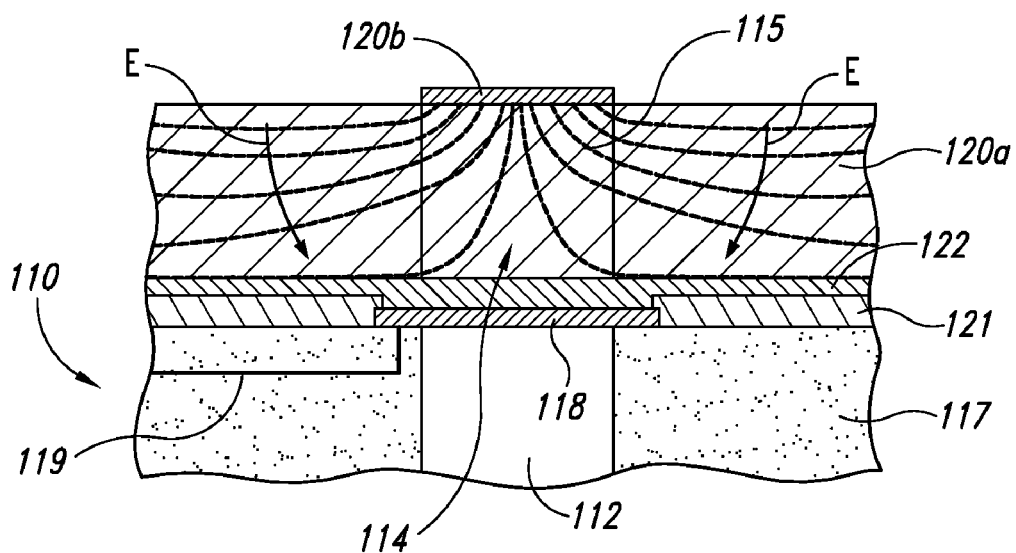

FIG. 3G illustrates another process by which the penetrating structure 114 can be formed. In this process, the first mask 120a is formed so that the base material 115 is applied directly over the via 112, with the second mask 120b providing protection in a manner generally similar to that described above. The first substrate 110 is then exposed to an etchant that etches both the first mask 120a and the base material 115, but not the second mask 120b. Accordingly, the upwardly facing surface of the first substrate 110 assumes successively changing shapes, as indicated by dashed lines and arrows E in FIG. 3G. At the end of the etching process, a generally triangular penetrating structure 114 is formed, and the second mask 120b lifts off or otherwise dissipates. Optionally, residual material from the first mask 120a can then be selectively removed without affecting the shape of the conductive base material 115. A conductive coating can then be added to the base material 115, and the portions of the plating buss 122 located away from the base material 115 can then be removed in a manner generally similar to that discussed above. In one embodiment, the foregoing method of removing both the first mask 120a and the base material 115 can be accomplished by exposing the first substrate 110 a multi-function removal agent, e.g., a mixture of a solvent (which can preferentially remove the first mask 120a) and an oxide/acid etchant (which can preferentially remove the base metal 115). In other embodiments, the first substrate 110 can be transferred back and forth between a solvent and an oxide/acid etchant to accomplish the same or a similar result.

Figure 4A:
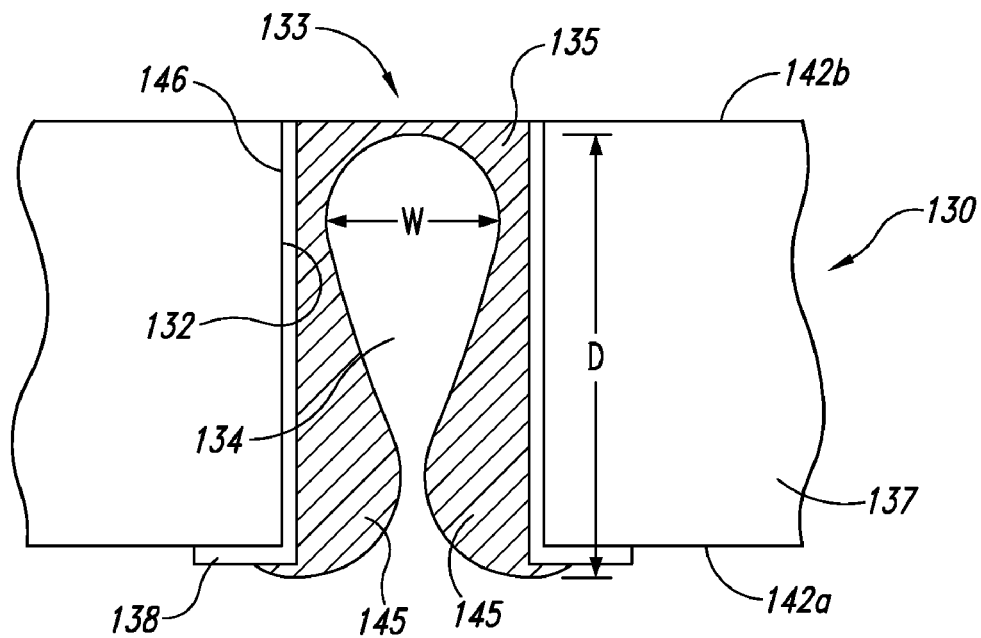
FIGS. 4A-4E schematically illustrate processes for forming recesses configured to receive a projection in accordance with embodiments of the disclosure.
Figure 4B:
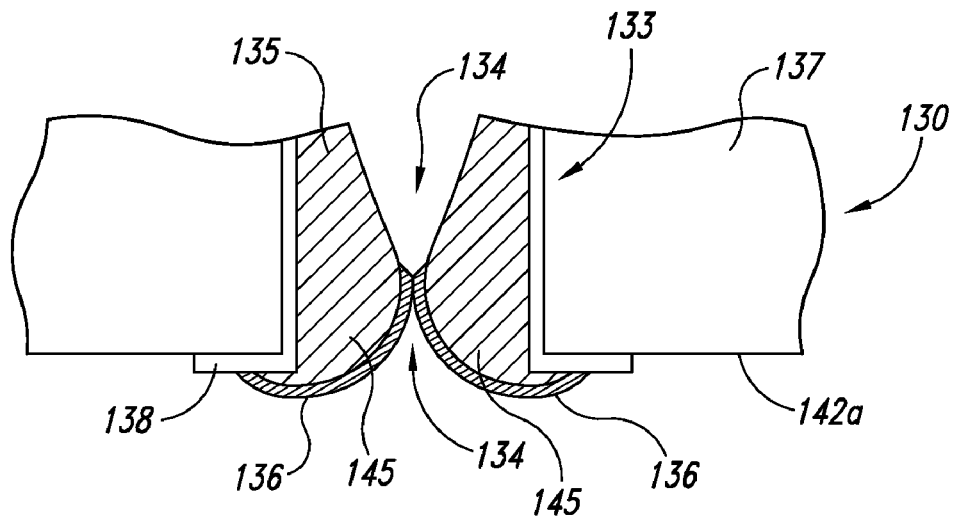

FIGS. 4A-4B illustrate a representative process for forming the recess 134 in the second substrate 130 in accordance with an embodiment of the disclosure. Beginning with FIG. 4A, the second substrate 130 can include a second substrate material 137 (e.g., silicon) having a first surface 142a, a second surface 142b, and a second via 132 that extends from the first surface 142a to the second surface 142b (e.g., a through-silicon via). The via 132 can extend through a bond pad 138 at the first surface 142a, and can have a diameter in the range of about 10-20 microns. The walls of the via 132 can be protected with a dielectric layer and/or a barrier layer 146. Optionally, a seed layer may be disposed in the second via 132 to facilitate subsequent metal formation processes.

The base material 135 can be disposed in the second via 132 using any of a variety of suitable processes, including vapor deposition processes (physical or chemical) and/or electrolytic or electroless deposition processes. The base material 135 can include copper in a particular embodiment. In other embodiments, e.g., when the penetrating structure received in the recess 134 includes uncoated gold, the base material 135 can also include gold. In a particular arrangement of an embodiment shown in FIG. 4A, the base material 135 may tend to "bread loaf," e.g., close off or pinch off the entrance opening of the second via 132. While this effect is typically undesirable when filling a via in most semiconductor processing applications, in a particular embodiment of the present disclosure, this effect can produce desirable results. In particular, this effect can produce a recess 134 having a depth D greater than or equal to a corresponding width W, with lobes 145 or other structures that project inwardly to engage with and at least resist the removal of a corresponding protrusion that is inserted into the recess 134.

FIG. 4B is an enlarged illustration of a portion of the second substrate 130 after a conductive coating 136 has been applied to the base material 135. The conductive coating 136 on one of the lobes 145 can contact the corresponding conductive coating 136 on the other lobe 145, effectively forming two separate portions of the recess 134. In other embodiments, the conductive coatings 136 on opposing lobes 145 can remain out of contact with each other so that the recess 134 is continuous. In either arrangement, as discussed above, the second conductive material 133 (e.g., the base material 135 and the conductive coating 136) can form a structure that provides both a mechanical and electrical interconnection with a corresponding penetrating structure, such as the penetrating structure 114 described above with reference to FIGS. 3A-3G.

Figure 4C:
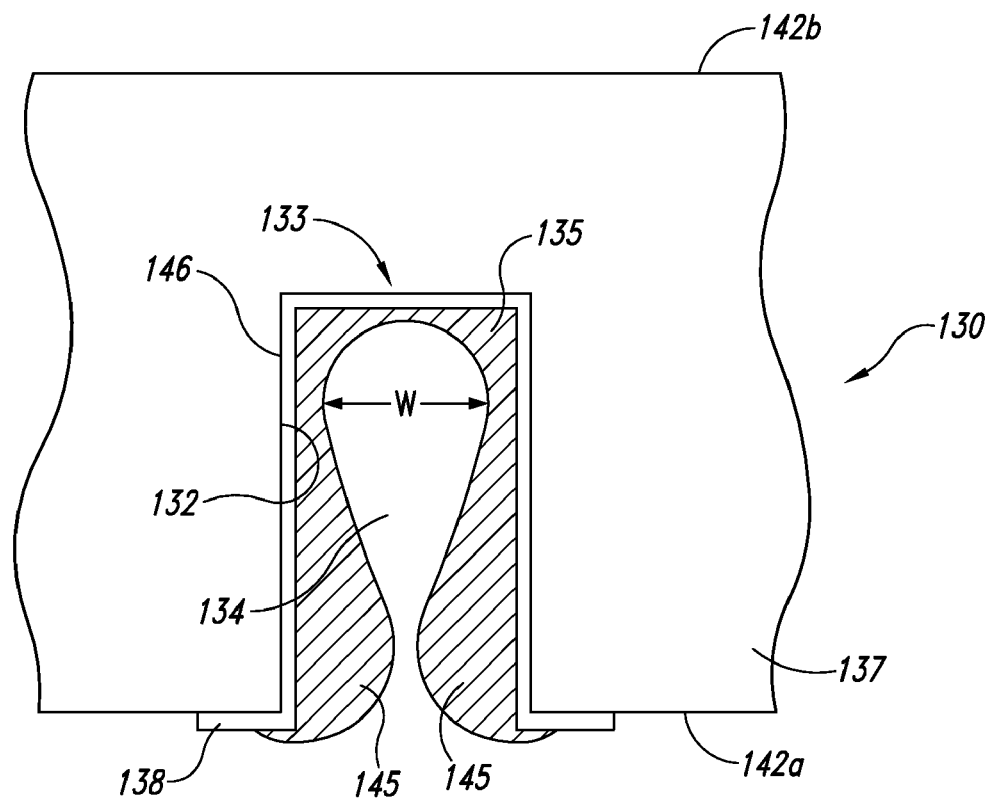

FIG. 4C illustrates a representative second substrate 130 in which a recess 134 has been formed in accordance with another embodiment of the disclosure. In this embodiment, the via 132 extends only part way between the first surface 142a and the second surface 142b of the second substrate 130. Accordingly, the via 132 can be a blind via. The recess 134 can be formed in the blind via 132 using techniques generally similar to those described above with reference to FIGS. 4A-4B. The resulting structure may be particularly suitable when the second substrate 130 is the outermost substrate in a stack of substrates. For example, the second substrate 130 shown in FIG. 4C can be used as the outermost or topmost third semiconductor substrate 150 shown in FIG. 1. One feature of this process is that additional connecting structures which would be formed if the second substrate 130 were in the middle of a stack of substrates need not be formed using the process shown in FIG. 4C.

Figure 4D:
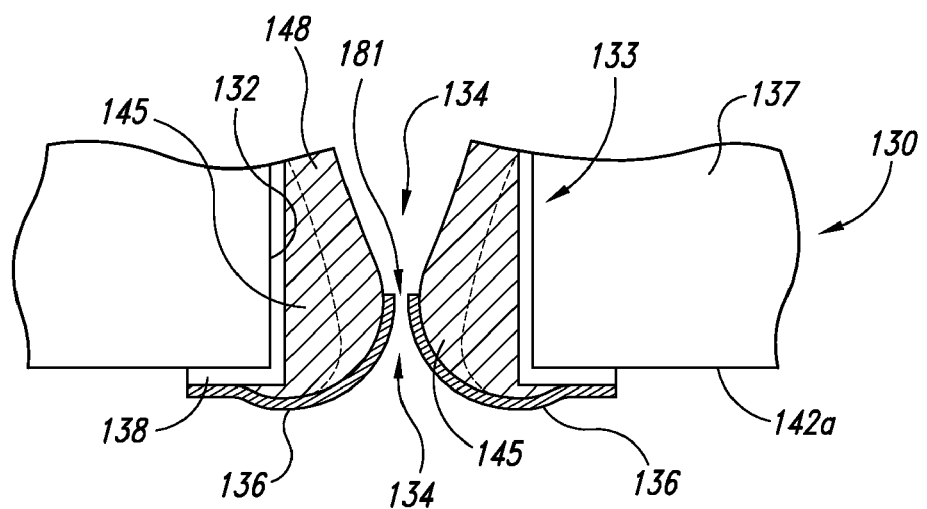
Figure 4E:
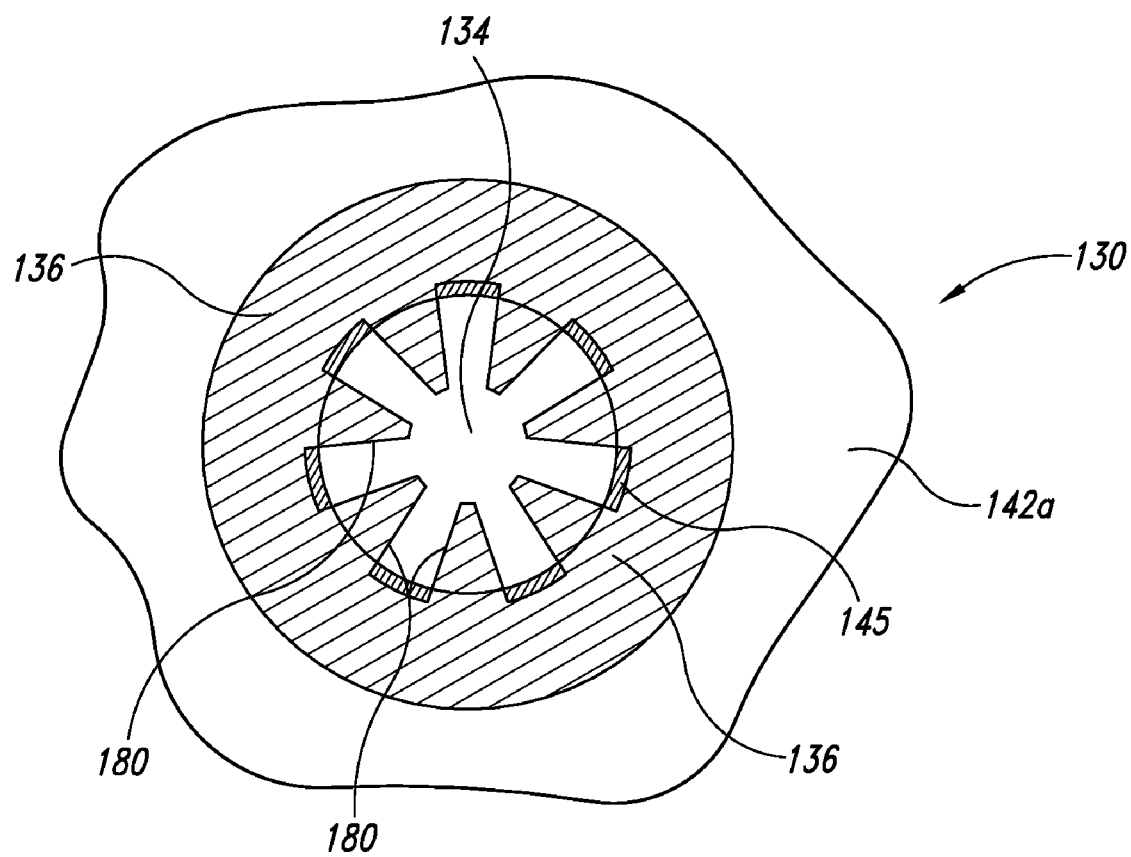

FIGS. 4D and 4E illustrate still another process for forming a recess 134 in accordance with a particular embodiment. Referring first to FIG. 4D, a support material 148 is disposed within the via 132. The support material 148 can include a base material generally similar to the base material 135 described above, or it can include another material, not necessarily a conductive material. The support material 148 can form lobes 145 which are sized so that when a coating or layer 136 is applied to the support material 148, it does not completely close off the via 132. This arrangement allows an etchant or other material removal agent to enter into the via 132 after the coating 136 has been applied. The removal agent is selected to preferentially remove the support material 148 (e.g., without removing the coating 136). Accordingly, the support material 148 can be removed to the position indicated by dashed lines in FIG. 4D, or to other positions. In some embodiments, the support material 148 can be completely removed. In any of these embodiments, the coating 136 can remain in position by virtue of its attachment to the bond pad 138 and optionally, by virtue of the support provided by any remaining support material 148 in the via 132, while one or more portions of the coating 136 are cantilevered into the recess 134. The coating or layer 136 can be conductive or non-conductive, depending upon whether the recess is to be used to form a mechanical/electrical connection, or mechanical connection. In either embodiment, the coating 136 is a representative example of an engaging material that is positioned to engage with a corresponding penetrating structure as described below.

FIG. 4E is a partially schematic illustration of the second substrate 130, looking approximately normal to the first surface 142a. As shown in FIG. 4E, the coating 136 has been selectively etched or otherwise treated to form conductive projections 180 that extend inwardly into the recess 134. Alternatively, the coating 136 need not undergo this material removal process. In either embodiment, referring now to both FIGS. 4D and 4E, portions of the coating 136 can form an inwardly angled structure that facilitates the process of receiving the corresponding penetrating structure, but resists motion of the penetrating structure out of the via 132. For example, the portions of the coating 136 can be angled radially and/or axially inwardly into the recess 134. In a particular embodiment, the unsupported (e.g., cantilevered) ends of the coating 136 projecting into the recess 134 can engage with an arrowhead-shaped penetrating structure to prevent or at least resist motion of the penetrating structure out of the recess 134 once it has entered the recess 134. Such a penetrating structure is described in further detail below with reference to FIGS. 5A-5D.

Figure 5A:
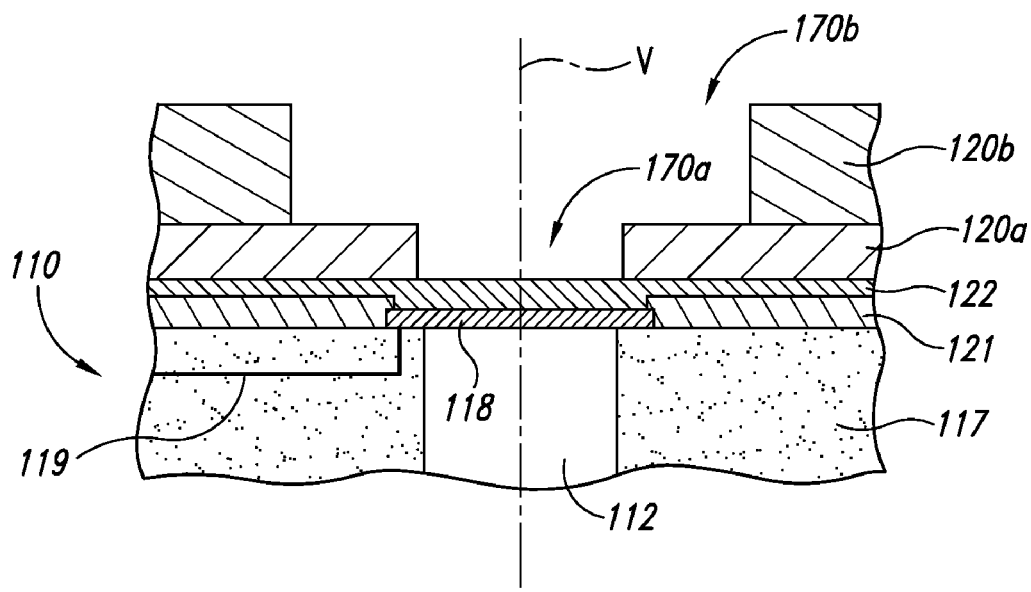
FIGS. 5A-5D schematically illustrate a process for forming a projection having a generally arrowhead-shape in accordance with another embodiment of the disclosure.
Figure 5B:
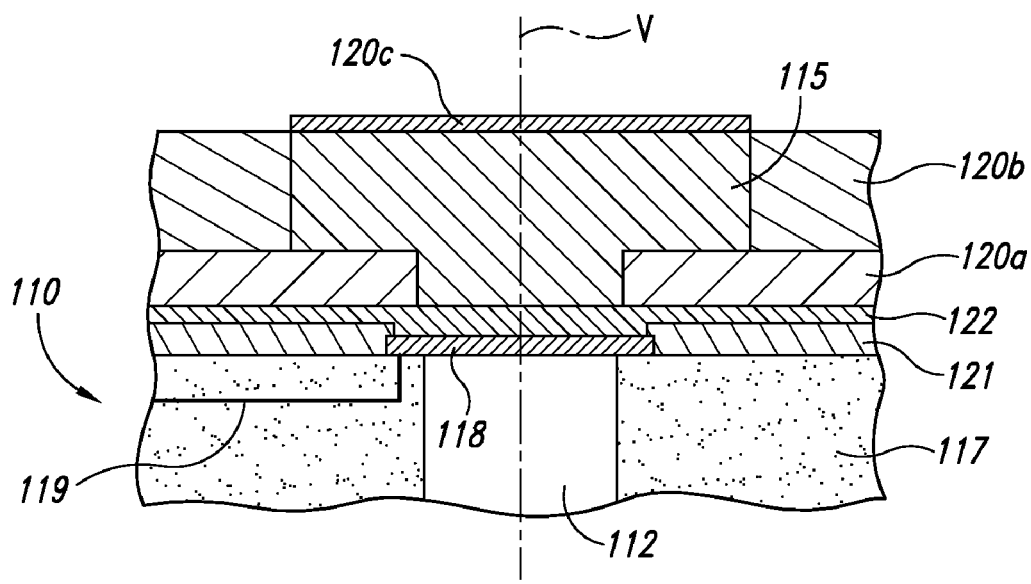

FIGS. 5A-8B illustrate penetrating structures and corresponding formation methods in accordance with further embodiments of the disclosure. FIG. 5A, for example, illustrates the first substrate 110 having a first mask layer 120a with a first aperture 170a aligned with the via axis V, and a second mask layer 120b with a larger second aperture 170b, also aligned with the via axis V. In FIG. 5B, a base material 115 has been applied to the bond pad 118 of the first substrate 110. A third mask 120c is then positioned over the base material 115.

Figure 5C:
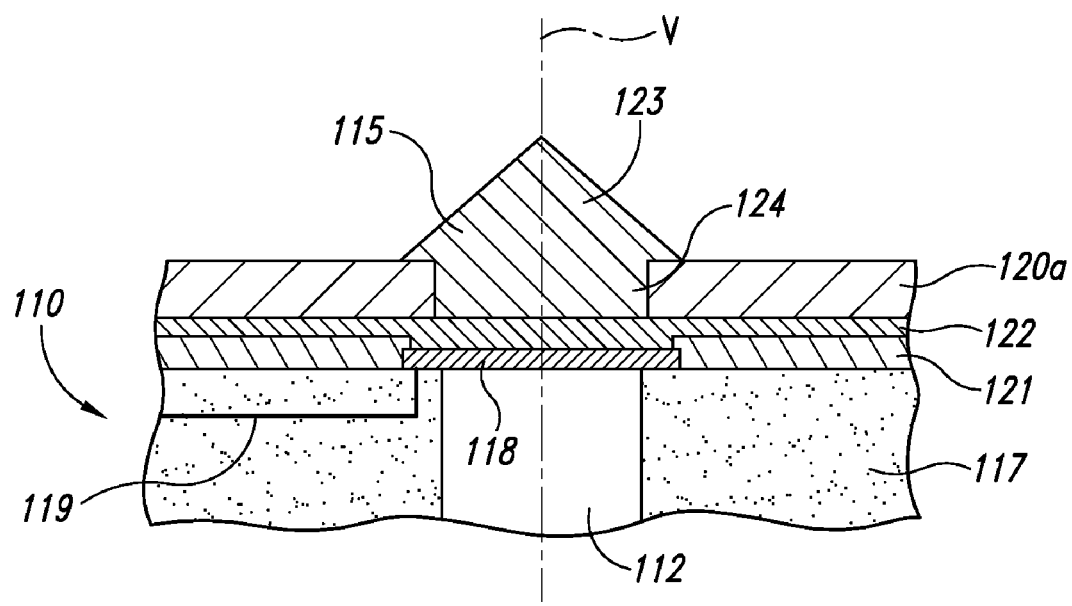

In FIG. 5C, the second mask layer 120b has been removed, and the base material 115 has been etched or otherwise processed in a manner generally similar to that described above with reference to FIG. 3C. Accordingly, the base material 115 has been formed into a head 123 having a generally triangular cross-sectional shape, and the third mask 120c, which protected the height of the head 123, has floated away or otherwise dissipated. The first mask layer 120a protects a lower portion of the base material 115, which forms a shaft 124.

Figure 5D:
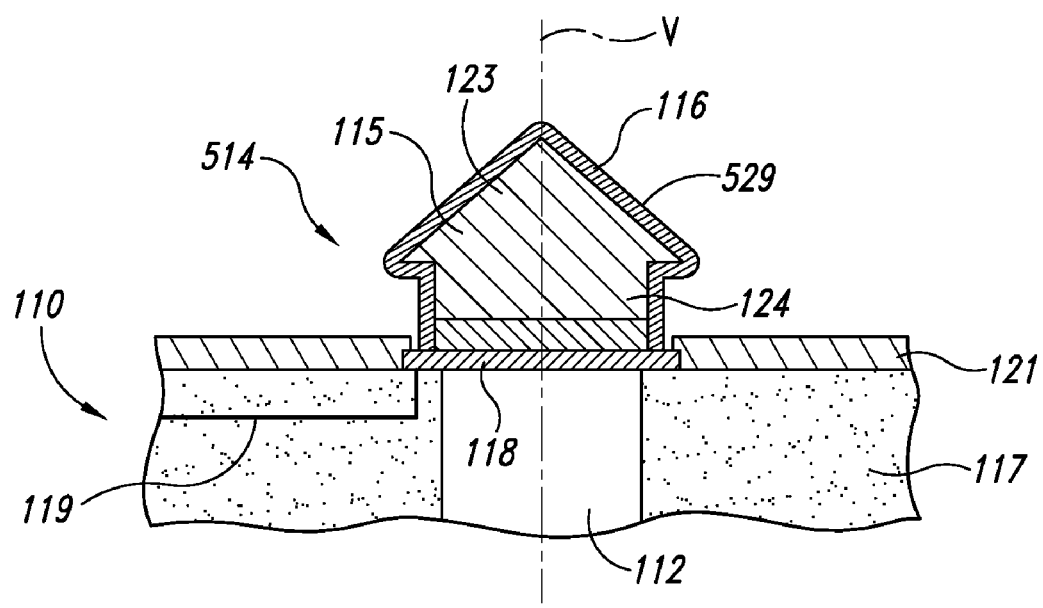

In FIG. 5D, the first mask layer 120a has been removed to expose the shaft 124, and the coating 116 has been applied to the base material 115, forming a penetrating structure 514. An external surface 529 of the penetrating structure 514 has a generally arrowhead-type, cross-sectional shape, and varies in a non-monotonic manner around the periphery of the penetrating structure 514. Accordingly, the penetrating structure 514 can both penetrate into the recess 134 described above with reference to FIGS. 2, 4A and 4B, and, by virtue of the head 123 being larger than the shaft 124, can interlock with the conductive material in the recess 134 and resist forces that may tend to dislodge the penetrating structure 114 from the recess 134. In addition, because portions of the external surface 529 are non-horizontal (e.g., have a component aligned with the via axis V), this arrangement can resist relative lateral movement between the semiconductor substrates joined with the penetrating structure 514, as described above.

Figure 6A:
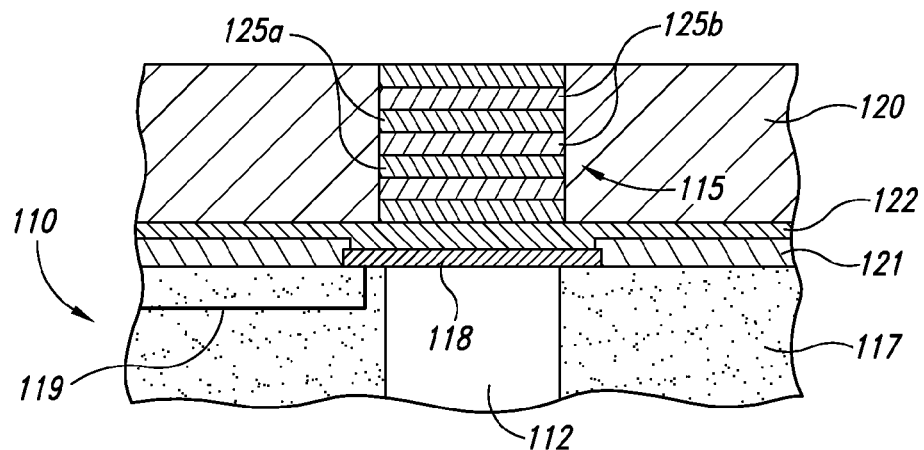
FIGS. 6A-6B schematically illustrate a process for forming a projection having protrusions and indentations in accordance with another embodiment of the disclosure.
Figure 6B:
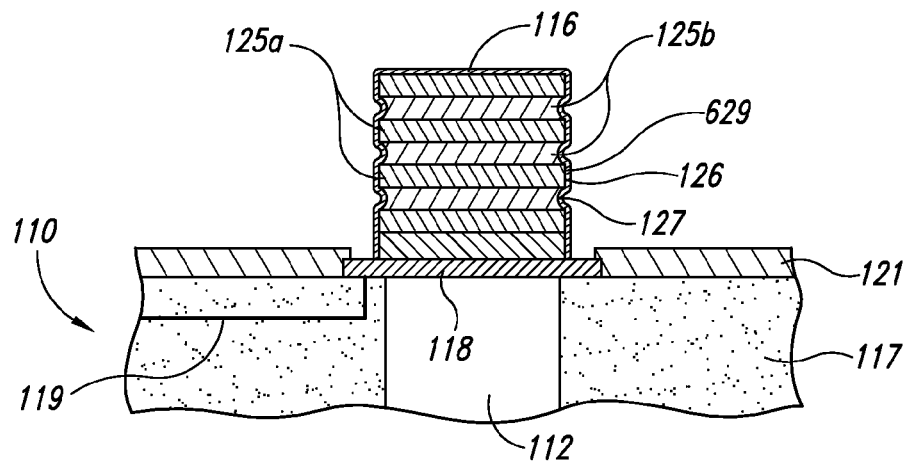

FIGS. 6A-6B illustrate a process for forming a penetrating structure in accordance with another embodiment of the disclosure. Beginning with FIG. 6A, a mask 120 is applied to the first semiconductor substrate 110, and a base material 115 is applied to the plating buss 122 overlying the bond pad 118, which is exposed via an opening in the mask. The deposition rate of the base material 115 can be varied during the course of the deposition process to produce alternating layers having different grain structures. For example, the alternating layers can include small grain layers 125a having a relatively fine grain structure, and large grain layers 125b having a coarser grain structure. The grain structure can be controlled by controlling the deposition rate (e.g., by controlling the current density) for each layer, e.g., thereby using a relatively slow deposition process to form the small grain layers 125a, and using a more rapid deposition process to form the large grain layers 125b.

In FIG. 6B, the mask 120 has been removed and the base material 115 has been exposed to an etchant. The large grain layers 125b, due to the coarse structure of the corresponding grains, are etched at a greater rate than are the small grain layers 125a. Accordingly, the resulting penetrating structure 614 can include protrusions 126 alternating with indentations 127. A coating layer 116 can then be applied to the base material 115. The resulting external surface 629 changes in a non-monotonic manner and can thus facilitate an interlocking engagement with the conductive material of a corresponding recess.

Figure 7:
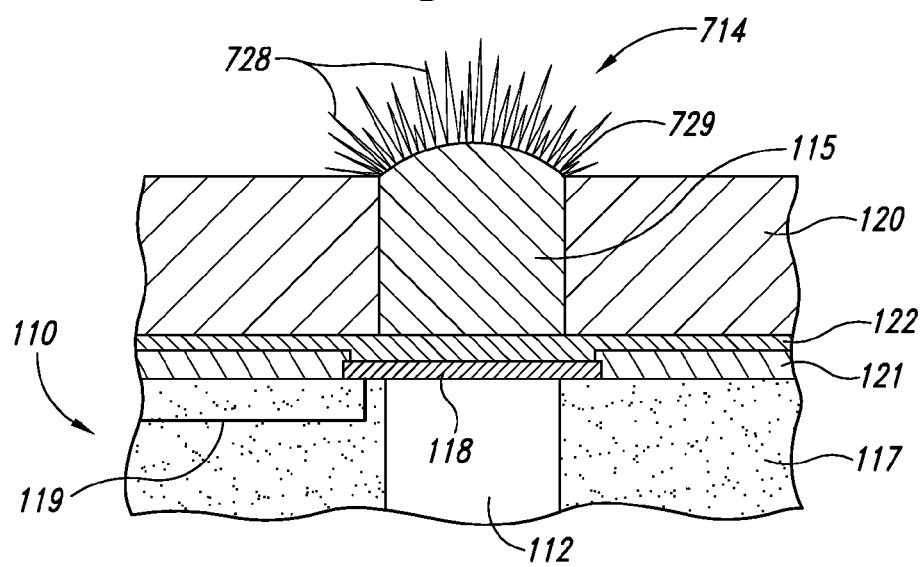
FIG. 7 schematically illustrates a process for forming a projection having dendritic structures in accordance with an embodiment of the disclosure.

FIG. 7 is a partially schematic illustration of a first substrate 110 having a penetrating structure 714 formed in accordance with another embodiment of the disclosure. The penetrating structure 714 can be formed by applying a mask 120 to the first substrate 110 and applying the base material 115 to the buss layer 122 overlying the bond pad 118 to form a generally columnar structure. After forming the columnar structure, dendritic structures 728 can be formed at the exposed end portion of the base material 115, and a coating layer (not shown in FIG. 7) can be applied to the dendritic structures 728. The dendritic structures 728 can be relatively small (e.g., on the order of one micron) and can be formed using existing electrolytic processes, but at elevated current densities compared with those used for typical fill processes. For example, the dendritic structures 728 can be formed using current densities of 50 amps per square foot or higher. As a result, the external surface 729 of the penetrating structure 714 varies in a non-monotonic manner, and includes indentations between neighboring dendritic structures 728, which can facilitate interlocking with the conductive material of a recess with which the penetrating structure 714 is engaged.

In other embodiments, the dendrite structures 728 can be formed by other techniques, and/or can have other shapes. For example, another technique for forming the dendritic structures 728 includes eliminating the levelers (which are typically used to encourage an overall even deposition process) during the formation of the penetrating structure 714, e.g., toward the end of the deposition process. In another example, the dendritic structure 728 can be formed along the sides of the penetrating structure 714, in addition to or in lieu of forming such structures at the end of the penetrating structure 714. This shape can be achieved by continuing the dendritic growth process after the mask 120 (or a portion of the mask 120) is removed, and can create a penetrating structure 714 with an enhanced ability to interlock with the conductive material of the recess into which the penetrating structure 714 is inserted.

Figure 8A:
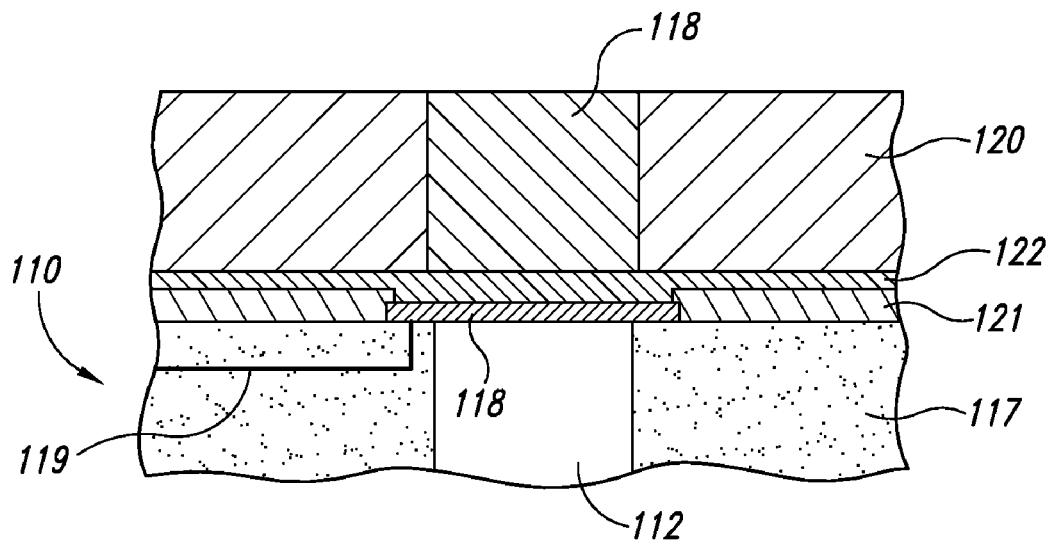
FIG. 8A-8B schematically illustrate a process for forming a projection having protrusions and indentations in accordance with another embodiment of the disclosure.
Figure 8B:
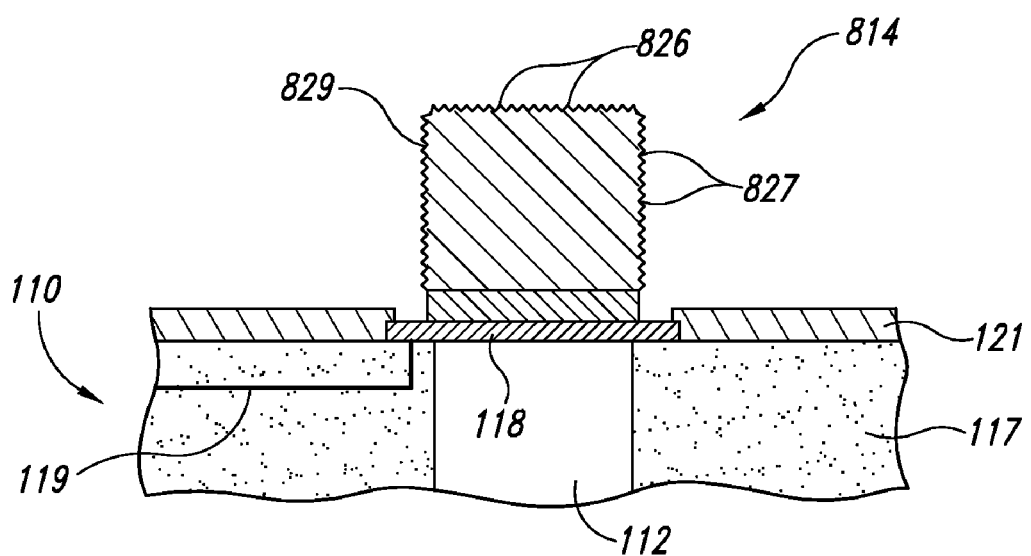

FIGS. 8A-8B illustrate yet another process for forming a penetrating structure 814 in accordance with another embodiment of the disclosure. The base material 115 is applied to the bond pad 118 using a mask 120, as shown in FIG. 8A. In FIG. 8B, the mask 120 is removed, and the base material 115 is subjected to an etching process which results in multiple protrusions 826 and indentations 827 at the end portion and side portions of the penetrating structure. Accordingly, these portions have an irregular external surface 829, e.g., one that varies in a non-monotonic manner. The etchant used to form the indentations 827 can be relatively aggressive, e.g., 40:2:1 (water:peroxide:hydrochloric acid). In other embodiments, the etchant can have other compositions. A coating layer (not shown in FIG. 7) can be applied to the base material 115 after the etching process is complete.

Figure 9A:
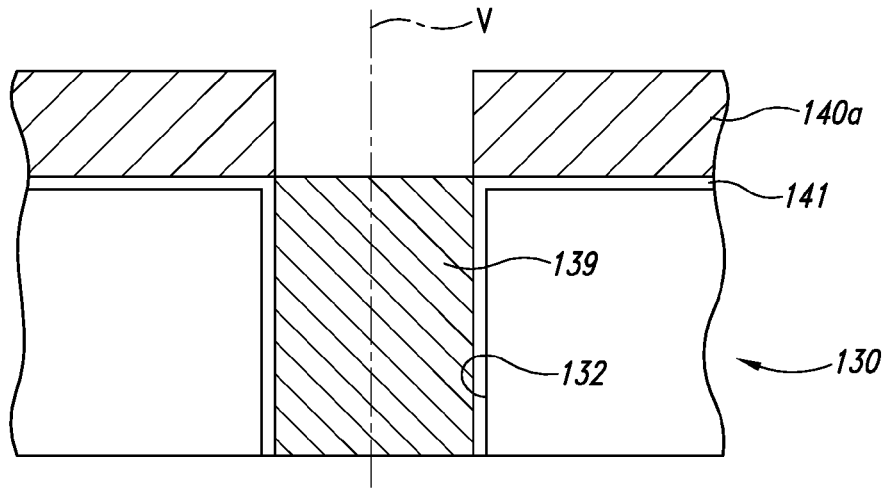
FIGS. 9A-9E schematically illustrate a process for forming a recess in accordance with further embodiments of the disclosure.
Figure 9B:
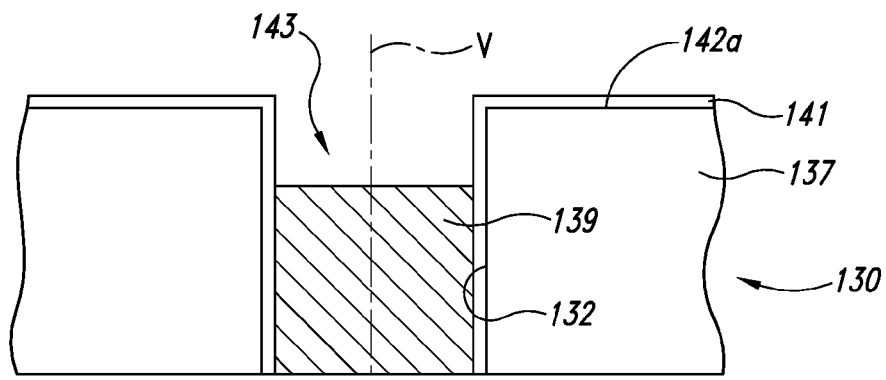
Figure 9C:
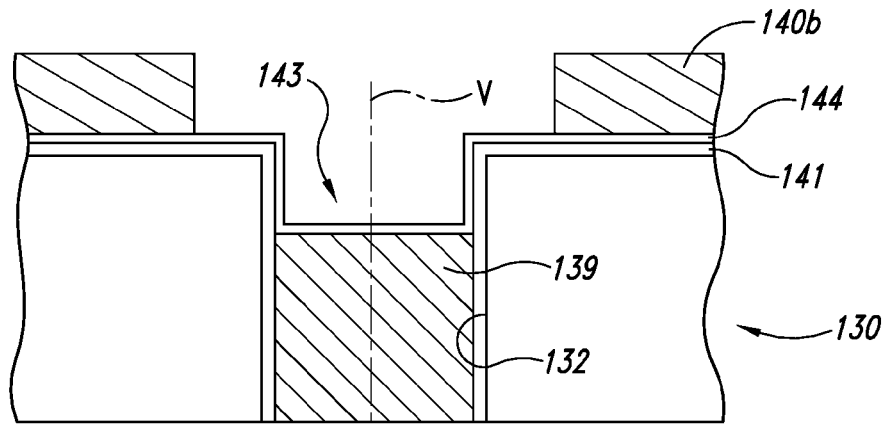
Figure 9D:
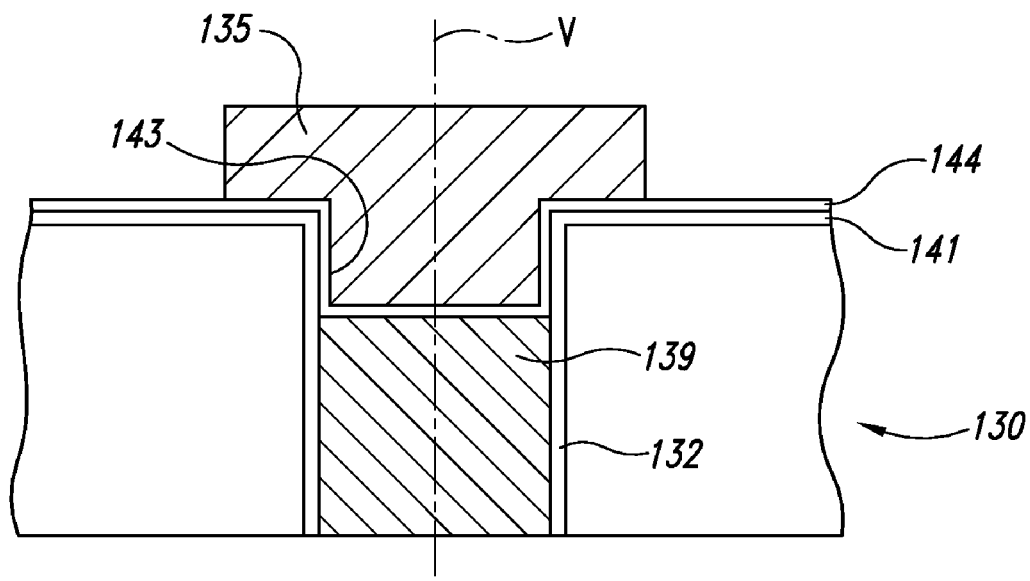

FIGS. 9A-9E illustrate a process for forming a recess that can receive any of the foregoing penetrating structures described above. Beginning with FIG. 9A, the process can include applying a fill material 139 to a dielectric material 141 lining the via 132 of the second substrate 130. A first mask 140a is then positioned on the second substrate 130, with an opening aligned with the via 131. In FIG. 9B, a portion of the fill material 139 is removed, creating a depression 143 that extends beneath the first surface 142a of the second substrate material 137. In FIG. 9C, a plating buss 144 has been applied to the second substrate 130, and a second mask 140b has been positioned over the plating buss 144 and processed to form an opening aligned with the via axis V. In FIG. 9D, the base material 135 has been applied to the second substrate 130 and the second mask 140b has been removed. It is expected that that presence of the depression 143 will improve the structural integrity of the connection between the base material 135 and the fill material 139.

Figure 9E:
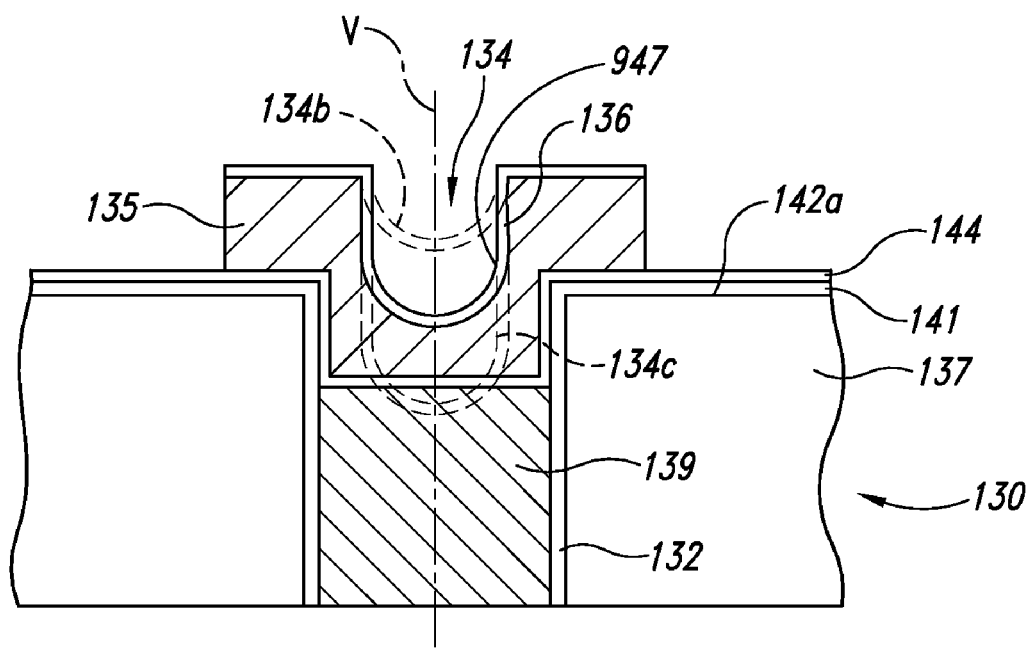

In FIG. 9E, the base material 135 has been etched or otherwise processed to form a recess 134. A coating 136 can be applied to the base material 135 to facilitate interconnection with any of the foregoing penetrating structures. Accordingly, the coating 136 can define an inner surface 947 that bounds the recess 134. The inner surface 947 can have any of a variety of shapes, depending upon the shape of the corresponding penetrating structure and/or other features. In a particular embodiment, the inner surface 947 can extend beneath the first surface 142a of the second substrate material 137, but not into the fill material 139. Alternatively, the inner surface 947 can extend into the fill material 139, as indicated in dashed lines as recess 134c, or it can remain above the second surface 142a, as is also indicated in dashed lines as recess 134b. In still another embodiment, the recess 134 can be filled with a conductive material, e.g., a silver paste or other conductive paste that is applied to the second substrate 130 in a screen printing or other process. In any of these embodiments, the recess 134 can receive, interlock with, and mechanically and electrically connect with the corresponding penetrating structure.

Figure 10A:
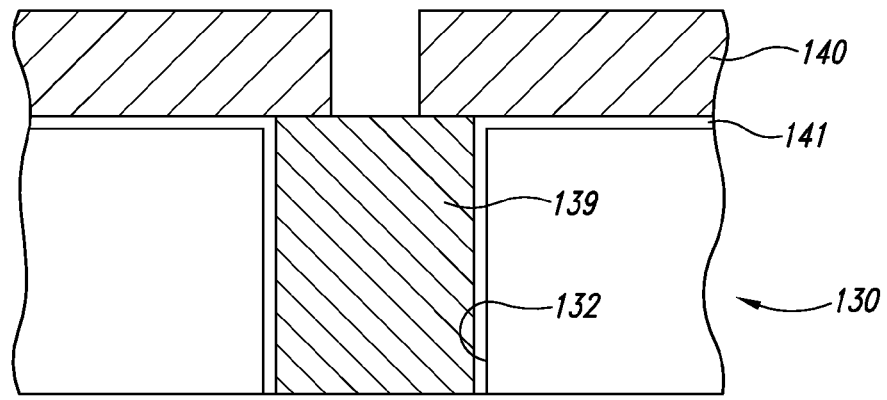
FIGS. 10A-10C schematically illustrate a process for forming a recess in accordance with still further embodiments of the disclosure.
Figure 10B:
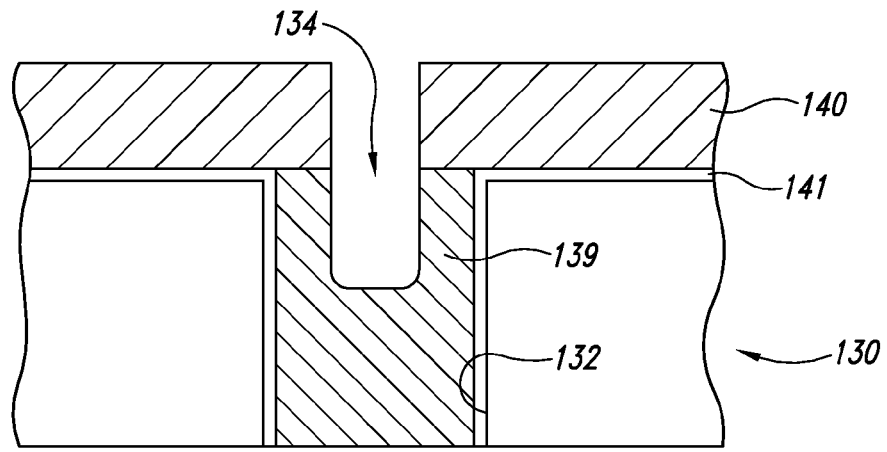
Figure 10C:
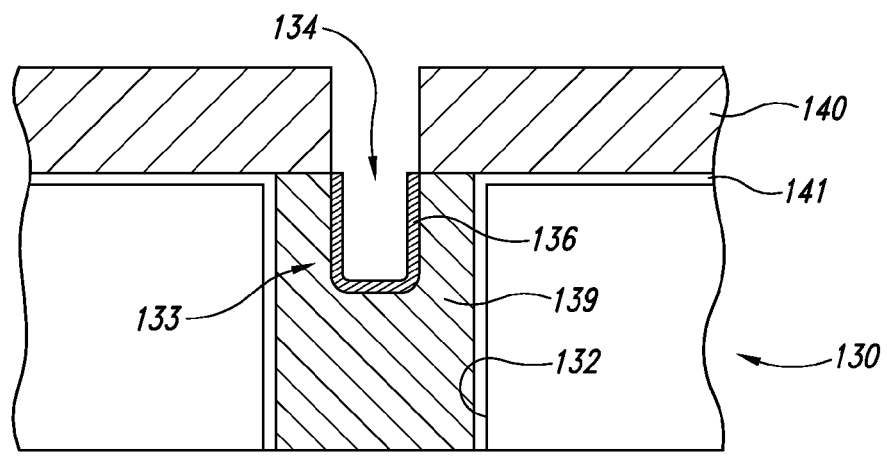

FIGS. 10A-10C illustrate another process for forming a recess that can receive any of the foregoing penetrating structures. FIG. 10A illustrates the second substrate 130 after a fill material 139 (e.g., copper) has been disposed in the via 132, and a mask 140 has been positioned over a portion of the fill material 139. In FIG. 10B, the recess 134 has been formed directly in the fill material 139, and in FIG. 10C, the conductive coating 136 has been applied to the walls of the recess 134. Accordingly, the fill material 139 and the coating material 136 can together form the second conductive material 133. The coating 136 can be applied using an immersion or other process. After the coating 136 is applied, the mask 140 can be removed and the second substrate 130 can be joined to the first substrate 110 (FIG. 2) using any of the foregoing joining techniques.

One expected result of the process shown in FIGS. 10A-10C is that it does not require adding a conductive base material to the fill material. Conversely, a potential result of the process described above with reference to FIGS. 9A-9E is that it can produce larger (e.g., wider) recesses in a given via width, which can provide an additionally robust connection with the corresponding penetrating structure.

One feature of several of the foregoing embodiments described above with reference to FIGS. 1-10C is that the stacked substrates can be joined using the combination of a receptacle or recess in one of the substrates, and a penetrating structure in the other. One expected result of this arrangement is that the features can be self-aligning. For example, the recess can have sloped entry surfaces and/or the penetrating structure can have sloped external surfaces. These surfaces can be sloped at acute angles relative to the via axis. Accordingly, as the two substrates are brought together, the penetrating structure and the recess can accommodate some misalignment, for example, a misalignment of several microns.

Another feature of several of the foregoing embodiments described above with reference to FIGS. 1-10C is that the penetrating structure includes non-horizontal surfaces that mate with corresponding non-horizontal surfaces of the recess. An expected result of this arrangement is that the non-horizontal interface between the external surface of the penetrating structure and the walls of the recess can resist lateral stresses and motion. In addition, the interlocking arrangement of the penetrating structure and the recess (e.g., the support provided by the recess walls) can better withstand vertical forces that might cause buckling in other connection arrangements.

Still another feature of at least some of the foregoing embodiments is that the interconnecting structures can be relatively small in size, and can be spaced close together. For example, in a particular embodiment, the penetrating structure and the recess can be formed in/on vias having a width of about 10 microns and a pitch of about 50 microns. In other embodiments, these dimensions can be smaller. An expected result of this arrangement is that it can reduce the overall size of the substrates and the packages into which they are incorporated, thus enabling the packages to be used in more compact applications.

Still another feature of at least several of the foregoing embodiments is that the connection between the penetrating structure and the recess can be achieved at relatively low temperatures and/or pressures. For example, when the penetrating structure and the recess include a tin cladding, the corresponding substrates can be pressed together and elevated to a temperature above the eutectic temperature, e.g., about 220° C. or less (and in a specific embodiment, about 217° C. for lead-free solder) to fuse the tin coatings. In embodiments in which the tin coating is eliminated and the penetrating structure and the recess each have exposed gold surfaces, the process can be conducted at room temperature, with the interface between the penetrating structure and the recess subjected to sonic energy (e.g., ultrasonic energy) to facilitate bonding between these elements. This is unlike at least some existing processes which typically require higher temperatures of up to 350° C. for bonding. For example, typical copper-to-copper bonding processes require high temperatures of 350° C. or more and high pressures of 200 megapascals or more.

Figure 11A:
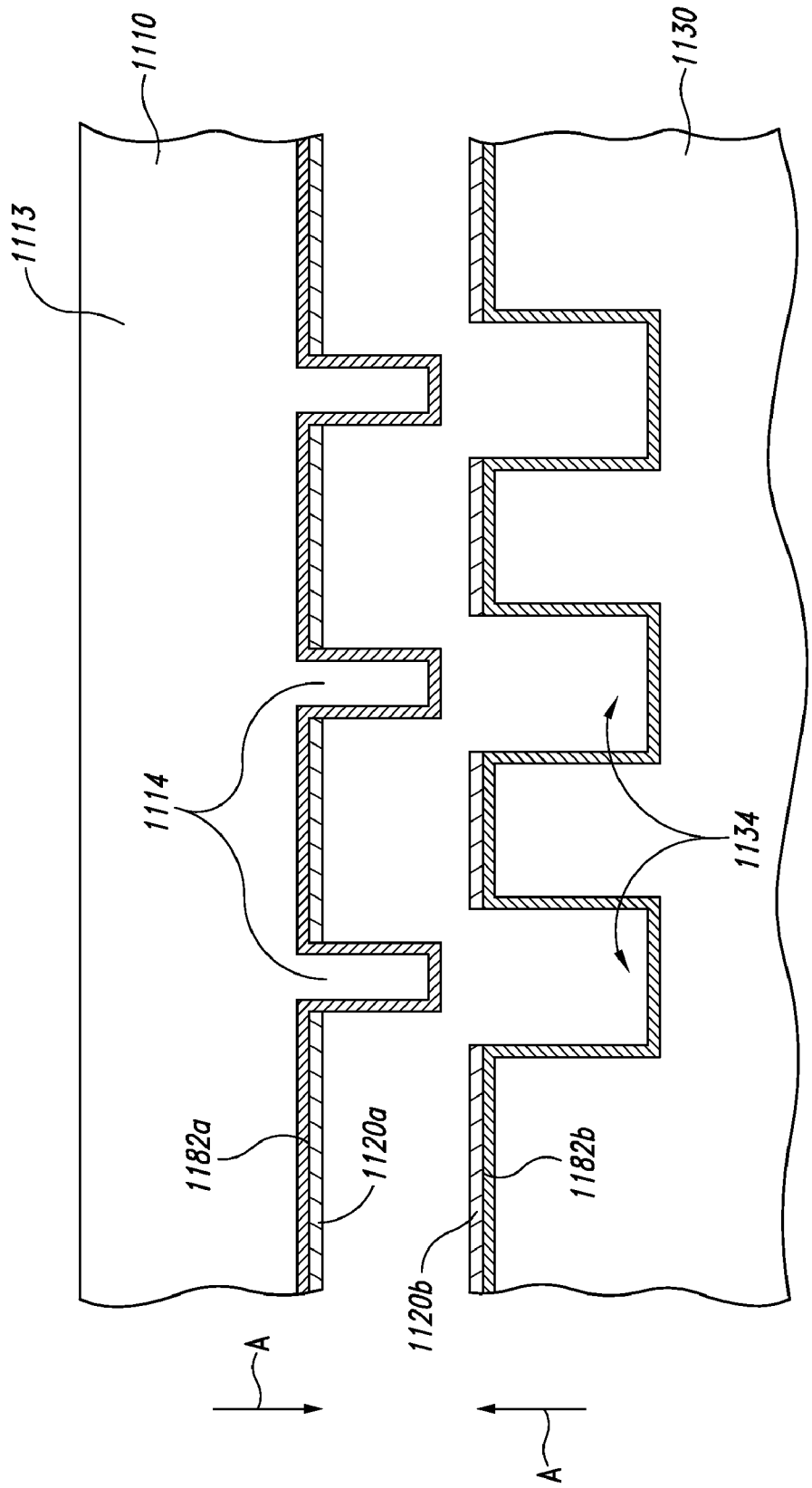
FIGS. 11A-11C illustrate a process for connecting semiconductor substrates in accordance with another embodiment of the disclosure.
Figure 11B:
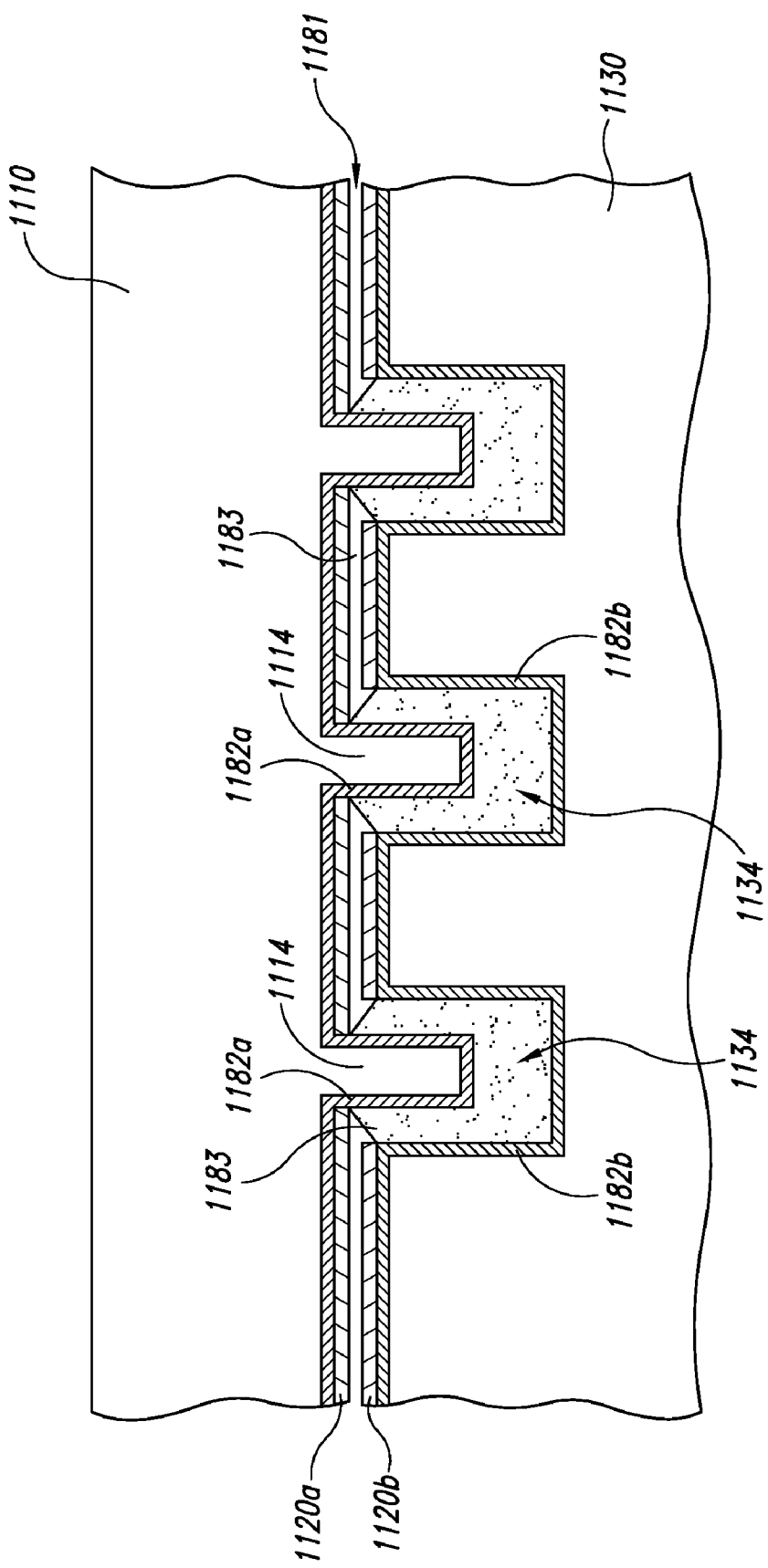
Figure 11C:
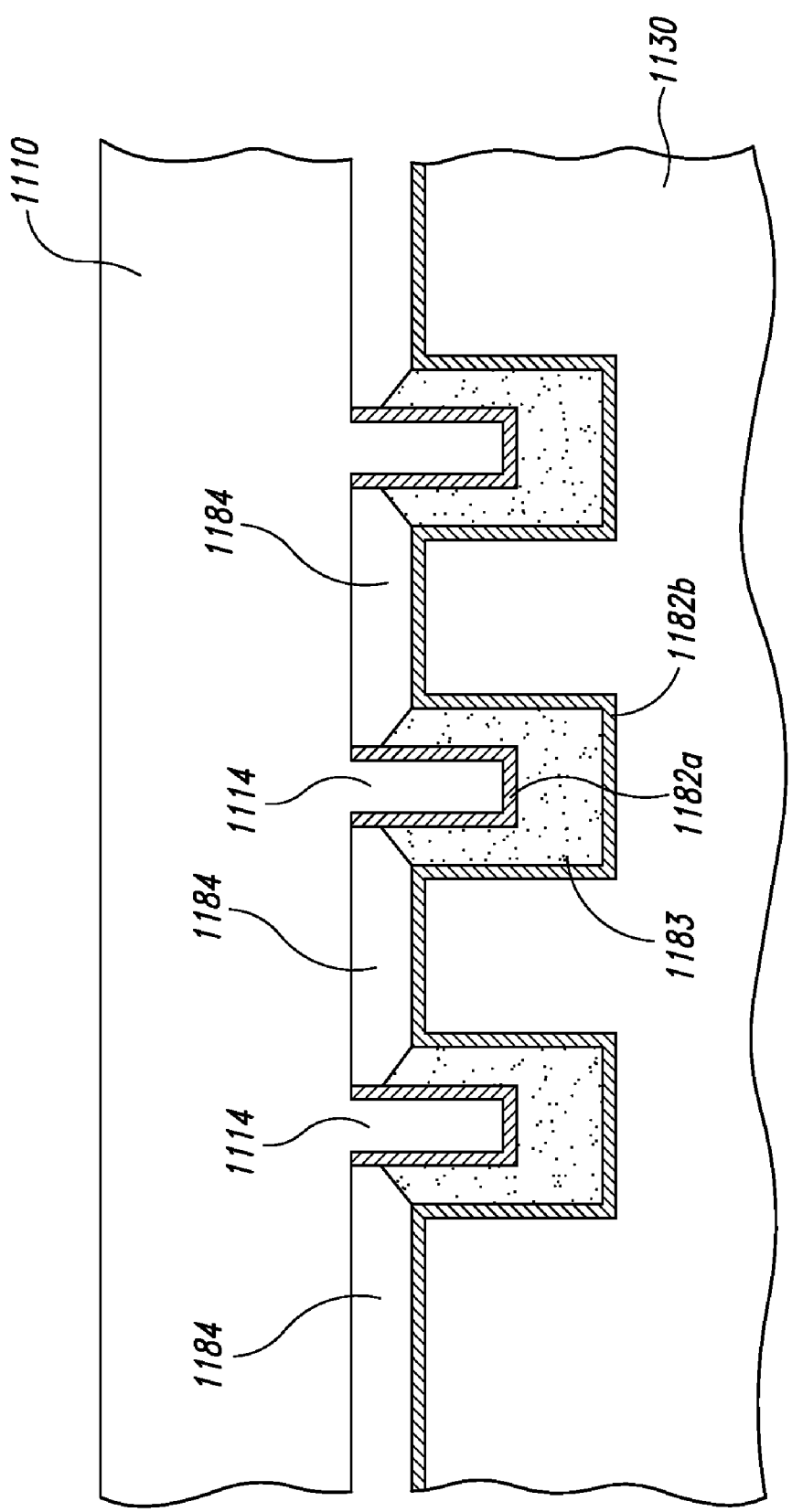

FIGS. 11A-11C schematically illustrate another process for forming recesses and penetrating structures, and interconnecting the penetrating structures with the recesses in a manner that can further reduce or eliminate the forces used to achieve a bond between stacked semiconductor substrates. Beginning with FIG. 11A, penetrating structures 1114 can be formed on or in a first substrate 1110, and corresponding recesses 1134 can be formed on or in a second substrate 1130. The penetrating structures 1114 can be formed from a conductive material in a particular embodiment, but in other embodiments, need not be formed from a conductive material and can instead be formed from other materials, including the first substrate material 1113. In any of these embodiments, the penetrating structures 1114 can have an outer surface that is conductive. For example, a first seed layer 1182a can be disposed over the penetrating structures 1114 and the adjacent surfaces of the first substrate 1110. A first mask 1120a can then be selectively disposed (or disposed and selectively removed) on the first substrate 1110 to cover the first seed layer 1182a in regions adjacent to the penetrating structure 1114, and leave the first seed layer 1182a exposed at the penetrating structures 1114.

The second substrate 1130 can receive a second seed layer 1182b that is disposed in the recesses 1134 and the adjacent portions of the second substrate 1130. A second mask 1120b can be disposed on the portions of the second seed layer 1182b positioned outside the recesses 1134. The first substrate 1110 and the second substrate 1130 are then moved relative to each other as indicated by arrows A so that the penetrating structures 1114 enter the recesses 1134.

FIG. 11B illustrates the first substrate 1110 and the second substrate 1130 after they have been moved relative to each other such that the penetrating structures 1114 enter the corresponding recesses 1134. While there may be incidental contact between the penetrating structures 1114 and the walls of the corresponding recesses 1134, the penetrating structures 1114 and recesses 1134 are generally not mechanically interlocked with each other. Accordingly, it is expected that the force (if any) required to move the substrates 1110, 1130 into the position shown in FIG. 11B is small or non-existent.

As shown in FIG. 11B, the first substrate 1110 and the second substrate 1130 can be separated by a gap 1181. The two substrates 1110, 1130 can then be subjected to an electroless, electrolytic, and/or other process in which a conductive material 1183 is disposed in the gap 1181. The conductive material 1183 forms a physical and electrical bond between the first seed layer 1182a carried by the first substrate 1110, and the second seed layer 1182b carried by the second substrate 1130. The regions between the neighboring recesses 1134 and between the neighboring penetrating structures 1114 are protected from the conductive material 1183 by the second mask 1120b and the first mask 1120a, respectively.

After the conductive material 1183 is disposed between the penetrating structures 1114 and the corresponding recesses 1134, the first and second masks 1120a, 1120b are removed. The portions of the first and second seed layers 1182a, 1182b positioned away from the penetrating structures 1114 and the recesses 1134 are then also removed, producing the structure shown schematically in FIG. 11C. At this point, as a result of the foregoing material removal processes, the assembly can include interstices 1184 at positions located outwardly from the bonds formed between the penetrating structures 1114 and the corresponding recesses 1134. These interstices 1184 can optionally be filled with a fill material, e.g., an underfill material or another suitable dielectric material. In another embodiment, these interstices 1184 can be left open, and in a particular arrangement, the interstices 1184 can form, in whole or in part, cooling channels that allow the first and second substrates 1110, 1113 to be convectively cooled. For example, the interface between the substrates 1110, 1113 can be cooled with a flow of air, de-ionized water, or fluoroinert.

In a particular embodiment of the foregoing processes, the first substrate 1110 is positioned above the second substrate 1130, so that the recesses 1134 open in an upward direction. It is expected that this arrangement will reduce the likelihood for gases to collect in the recesses 1134 during processing. While the penetrating structures 1114 are shown in FIGS. 11A-11C as simple columnar structures, in other embodiments, they can have other shapes, including any of the foregoing shapes described above. Such shapes can provide additional surface area beyond that provided by the simple columnar structures shown in FIGS. 11A-11C and can accordingly increase the strength, robustness, and/or reliability of the resulting physical and electrical bonds.

Other features of the foregoing embodiments may also be combined with the arrangement shown in FIGS. 11A-11C. For example, in some embodiments, structures generally similar to those described above with reference to FIGS. 2-10C, in which a mechanical interlock is formed upon the entry of the penetrating structures into the corresponding recesses, can be used at selective locations between the first and second substrates 1110, 1130 shown in FIGS. 11A-11C. This arrangement can be used to maintain a consistent gap 1181 at the interface between the first and second substrates 1110, 1130, and can support the two substrates in a fixed position relative to each other while they undergo the processing steps described above with reference to FIGS. 11B-11C. In any of these embodiments, it is expected that the force required to engage the two substrates 1110, 1130 with each other for the purpose of providing a physical and/or electrical connection between the two substrates, can be significantly reduced when compared with existing methods for connecting semiconductors substrates.

Figure 12:
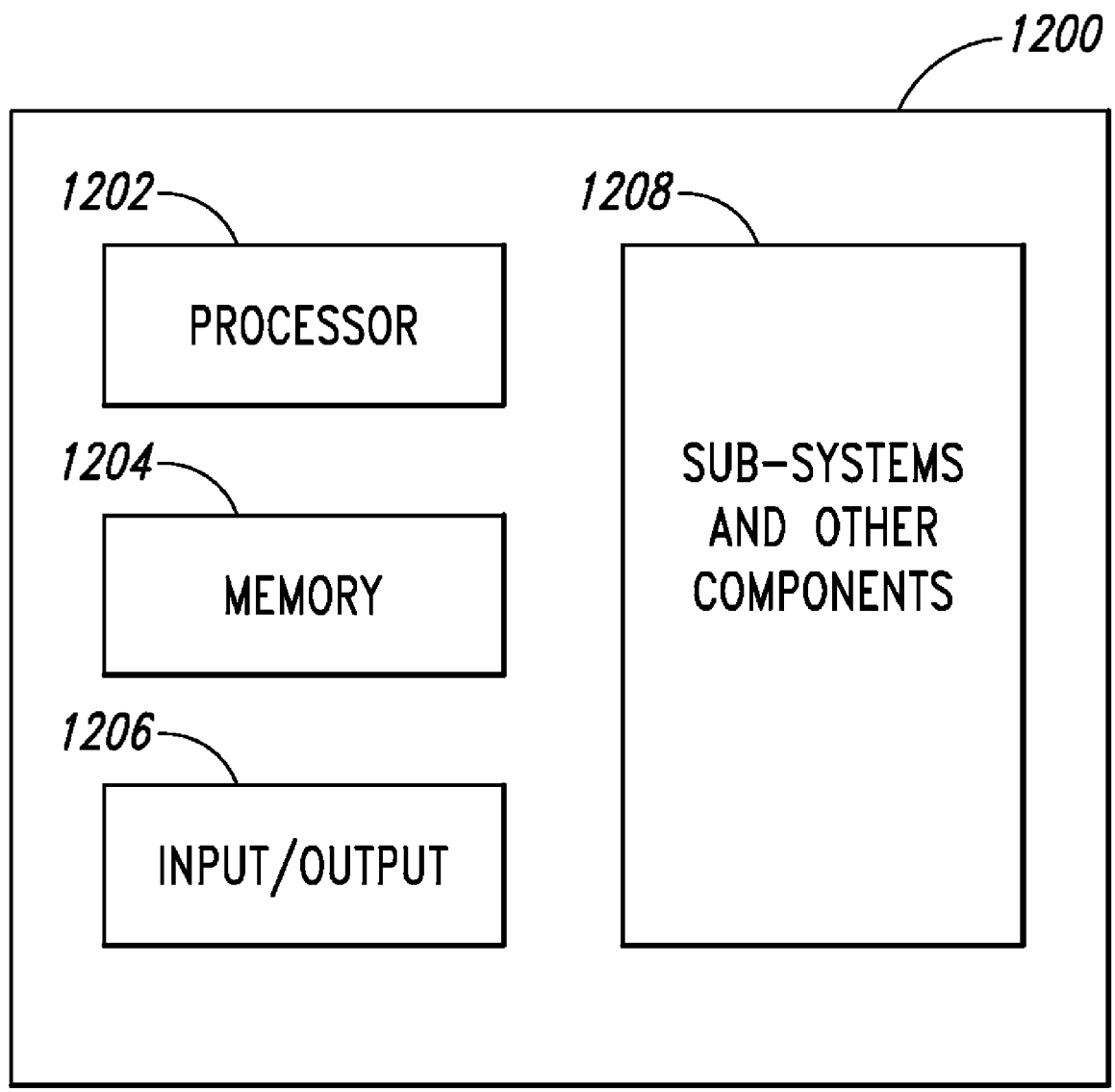
FIG. 12 is a schematic illustration of a system that can include one or more packages configured in accordance with several embodiments of the disclosure.

Any of the semiconductor packages resulting from joining the semiconductor substrates in accordance with the methods and structures described above with reference to FIGS. 11A-11C can be incorporated into a myriad of larger and/or more complex systems, a representative example of which is a system 1200 shown schematically in FIG. 12. The system 1200 can include a processor 1202, a memory 1204 (e.g., SRAM, DRAM, Flash memory and/or other memory device), input/output devices 1206 (e.g., a sensor and/or transmitter), and/or other subsystems or components 1208. Semiconductor packages having any one or a combination of the features described above with reference to FIGS. 1-11C may be included in any of the devices shown in FIG. 12. The resulting system 1200 can perform any of a wide variety of computing, processing, storage, sensing, imaging, and/or other functions. Accordingly, the representative system 1200 includes without limitation, computers and/or other data processors, for example, desktop computers, laptop computers, internet appliances, hand-held devices (e.g., palm-top computers, wearable computers, cellular or mobile phones, personal digital assistants, music players, cameras, etc.), multi-processor systems, processor-based or programmable consumer electronics, network computers and mini-computers. Other representative systems 1200 may be housed in a single unit or distributed over multiple interconnected units (e.g., through a communication network). The components of the system 1200 can accordingly include local and/or remote memory storage devices, and any of a wide variety of computer-readable media.

From the foregoing, it will be appreciated that specific embodiments have been described herein for purposes of illustration, but that the foregoing systems and methods may have other embodiments as well. For example, while certain of the embodiments described above were described in the context of semiconductor packages having two or three stacked dies, in other embodiments, the packages can include other numbers of stacked dies. Many of the processes for forming the foregoing connecting structures and connecting the mating structures of different semiconductor substrates can be carried out of the die level (e.g., after singulating the dies), the wafer level (e.g., before singulating the dies) and/or at other processing stages. Accordingly, the bonding processes may be used to bond an individual die to another individual die, or to bond an individual die to a wafer or portion of a wafer, or to bond a wafer or portion of a wafer to another wafer or portion of a wafer. The wafer or wafer portion (e.g., wafer form) can include an unsingulated wafer or wafer portion, or a repopulated carrier wafer. The repopulated carrier wafer can include an adhesive material (e.g., a flexible adhesive) surrounded by a generally rigid frame having a perimeter shape comparable to that of an unsingulated wafer, with singulated elements (e.g., die) carried by the adhesive.

In some case, conductive materials may be applied in bulk directly on a dielectric barrier layer (e.g., via a direct on-barrier plating process) and in other embodiments, a conductive seed layer may first be applied to the dielectric barrier layer. The recesses and penetrating structures can have different sizes and/or shapes than those shown in the Figures, and the sizes/shapes of the recesses and corresponding penetrating structures can be tailored to be suitable/compatible with each other. The penetrating structures can contact material in the corresponding recess as they enter the recess or, as shown in FIGS. 11A-11C, the penetrating structures can penetrate (e.g., enter) the recesses with little or no contact with the recess walls, and a bond or a stronger bond can be formed between the penetrating structures and the recesses after penetration.

Certain features described in the context of particular embodiments may be combined or eliminated in other embodiments. For example, the structure shown in FIGS. 6B or 8B can be combined with the triangular structure shown in FIGS. 5D or 2. The support member 101 shown in FIG. 1 can be eliminated in some embodiments. Further, while features and results associated with certain embodiments have been described in the context of those embodiments, other embodiments may also exhibit such features and results, and not all embodiments need necessarily exhibit such features and results. Accordingly, the disclosure can include other embodiments not shown or described above.

We claim:

1. A semiconductor system, comprising:
   a first semiconductor substrate having a first substrate material;
   a first conductive material carried by the first semiconductor substrate and forming a penetrating structure;
   a second semiconductor substrate having a second substrate material with a first surface, a second surface facing away from the first surface, and a through-substrate via extending from the first surface to the second surface along a via axis; and
   a second conductive material carried by the second semiconductor substrate and having a pre-formed recess positioned along the via axis, the penetrating structure being received in the recess and being in mechanical and electrical contact with the second conductive material, the second conductive material being a first distance from the via axis at a first position in the recess and a second distance larger than the first distance from the via axis at a second position in the recess, wherein the second position is deeper in the recess than the first position.

2. The system of claim 1 wherein the recess has a first dimension along the via axis and a second dimension transverse to the via axis, the first dimension being greater than or equal to the first dimension.

3. The system of claim 1 wherein the recess extends inwardly into the via away from first surface.

4. The system of claim 1 wherein the second conductive material extends outwardly from the first surface along the via axis, and wherein the recess is formed in the second material, with at least a portion of the recess being positioned outwardly from the first surface.

5. The system of claim 1 wherein the first semiconductor material forms at least part of a first semiconductor die and the second semiconductor material forms at least part of a second semiconductor die, and wherein the system further comprises an adhesive positioned and attached between the first and second semiconductor dies.

6. The system of claim 1 wherein the first semiconductor material forms at least part of a first semiconductor die and the second semiconductor material forms at least part of a second semiconductor die, and wherein the second semiconductor material includes a through-substrate via having the recess at one end of the via and a projection at the other end of the via, and wherein the system further comprises a third semiconductor die having a recess in which the projection of the second semiconductor die is received.

7. The system of claim 1 wherein the first semiconductor material forms at least part of a first semiconductor die and the second semiconductor material forms at least part of a second semiconductor die, and wherein the pre-formed recess is defined at least in part by opposing lobes that face toward each other from opposite side of the recess, further wherein the penetrating structure has a generally arrowhead-shaped cross-section received in the recess.

8. A semiconductor system, comprising:
a first semiconductor substrate material having a through-substrate via extending along a via axis;
a conductive material disposed in the via;
a penetrating structure aligned with and extending away from the via, the penetrating structure having at least one sharp tip extending away from the via, and
a second semiconductor substrate material having a conductive receptacle, the penetrating structure being received in the conductive receptacle, and the conductive receptacle being deformed by the penetrating structure.

9. The semiconductor system of claim 8 wherein the penetrating structure includes a single surface feature having a generally triangular cross-sectional shape when intersected by a plane generally aligned with the via axis.

10. The semiconductor system of claim 9 wherein the single surface feature includes a head having the generally triangular cross-sectional shape, and a shaft positioned between the head and the via.

11. The semiconductor system of claim 8 wherein the at least one generally sharp surface feature includes multiple projections extending away from the via in at least one of a first direction generally aligned with the via axis, and a second direction generally transverse to the via axis.

12. The semiconductor system of claim 11 wherein the multiple projections include dendritic growth structures projecting from an underlying material of the penetrating structure.

13. The semiconductor system of claim 11 wherein the multiple projections include are spaced apart by recesses etched into an underlying material of the penetrating structure.

14. The semiconductor system of claim 8 wherein the penetrating structure is positioned toward a first end of the via, the conductive receptacle is a first conductive receptacle, and wherein the system further comprises a second conductive receptacle positioned toward a second end of the via, the second conductive receptacle being positioned to receive a corresponding penetrating structure of another semiconductor substrate.

15. A semiconductor system, comprising:
a first semiconductor substrate having a first substrate material;
a penetrating structure carried by the first semiconductor substrate;
a second semiconductor substrate having a second substrate material, the second semiconductor substrate including a second conductive material having a pre-formed recess in which the penetrating structure is received, the penetrating structure being mechanically engaged with the recess and secured to the second semiconductor substrate, wherein the second conductive material has a non-uniform thickness in the recess.

16. The system of claim 15 wherein:
the first semiconductor substrate includes a first through-substrate via extending entirely through the first substrate material along a via axis;
the penetrating structure includes a first conductive material projecting outwardly from the first through-substrate via along the via axis;
the second semiconductor substrate and a second through-substrate via extending entirely through the second substrate material along the via axis;
the recess is aligned along the via axis and carries the second conductive material;
the first conductive material of the penetrating structure is mechanically interconnected with the second conductive material of the recess;
the first conductive material of the penetrating structure is in electrical contact with the second conductive material of the recess; and
the second conductive material of the recess is positioned to at least restrict axial motion of the penetrating structure out of the recess.

17. The system of claim 16 wherein the penetrating structure includes a first conductive material, wherein the first and second conductive materials form an electrical connection between the first and second semiconductor substrates.

18. The system of claim 17 wherein the first and second conductive materials are in direct contact with each other.

19. The system of claim 17, further comprising a third conductive material disposed between the first and second conductive materials.

20. The system of claim 16 wherein the recess includes an inwardly projecting conductive material that is at least partially cantilevered within the recess.

21. The system of claim 20 wherein the inwardly projecting conductive material bears against at least a portion of the penetrating structure and is positioned to resist withdrawal of the penetrating structure from the recess.

* * * * *

UNITED STATES PATENT AND TRADEMARK OFFICE
CERTIFICATE OF CORRECTION

| | | |
|---|---|---|
| PATENT NO. | : 7,872,332 B2 | Page 1 of 1 |
| APPLICATION NO. | : 12/209029 | |
| DATED | : January 18, 2011 | |
| INVENTOR(S) | : Owen R. Fay et al. | |

It is certified that error appears in the above-identified patent and that said Letters Patent is hereby corrected as shown below:

In The Claims:
In column 15, line 33, in Claim 8, delete "via," and insert -- via; --, therefor.

Signed and Sealed this
Fifteenth Day of March, 2011

David J. Kappos
*Director of the United States Patent and Trademark Office*

UNITED STATES PATENT AND TRADEMARK OFFICE
CERTIFICATE OF CORRECTION

PATENT NO. : 7,872,332 B2  
APPLICATION NO. : 12/209029  
DATED : January 18, 2011  
INVENTOR(S) : Owen R. Fay et al.

It is certified that error appears in the above-identified patent and that said Letters Patent is hereby corrected as shown below:

In the Claims:
At column 14, claim 2, line 63: "first dimension" should be --second dimension--.

Signed and Sealed this
Fourteenth Day of May, 2013

Teresa Stanek Rea
*Acting Director of the United States Patent and Trademark Office*